US008839163B2

(12) United States Patent
Ootsubo

(10) Patent No.: US 8,839,163 B2
(45) Date of Patent: Sep. 16, 2014

(54) BEHAVIORAL SYNTHESIS METHOD, BEHAVIORAL SYNTHESIS PROGRAM AND BEHAVIORAL SYNTHESIS APPARATUS

(71) Applicant: Renesas Electronics Corporation, Kanagawa (JP)

(72) Inventor: Motohide Ootsubo, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/668,795

(22) Filed: Nov. 5, 2012

(65) Prior Publication Data
US 2013/0132916 A1 May 23, 2013

(30) Foreign Application Priority Data
Nov. 18, 2011 (JP) .................................. 2011-252263

(51) Int. Cl.
*G06F 17/50* (2006.01)
(52) U.S. Cl.
CPC .................................. *G06F 17/5045* (2013.01)
USPC ........... 716/104; 716/100; 716/101; 716/102; 716/103
(58) Field of Classification Search
USPC ................................................ 716/100–104
See application file for complete search history.

(56) References Cited

U.S. PATENT DOCUMENTS

| 6,367,066 | B1 * | 4/2002 | Sato | 716/103 |
| 7,913,204 | B2 * | 3/2011 | Masuda | 716/104 |
| 2009/0326901 | A1 * | 12/2009 | Kojima | 703/14 |

FOREIGN PATENT DOCUMENTS

| JP | 2861994 B1 | 2/1999 |
| JP | 2011-034517 A | 2/2011 |

OTHER PUBLICATIONS

Matsunaga, "High-Level Synthesis",Graduate School of Information Science and Electrical Engineering, Kyushu University, <URL:http://www.c.csce.kyushu-u.ac.jp/~matsunaga/lecture/Isicad/pdf/Lecture06.pdf>.

* cited by examiner

*Primary Examiner* — Nghia Doan
(74) *Attorney, Agent, or Firm* — Mattingly & Malur, PC

(57) ABSTRACT

A behavioral synthesis method according to the present invention includes generating a scheduled CDFG based on behavioral description information, generating a lifetime for each variable based on the scheduled CDFG, selecting m variables whose lifetimes do not overlap on a time axis, allocating a first register to a first variable having a first bit width and bits of the first bit width within another variable, allocating a second register to bits other than the bits of the first bit width within another variable, and outputting circuit information of a synthesized circuit including the first and second registers.

19 Claims, 32 Drawing Sheets

| TYPE | EXTERNAL INPUT VARIABLE |
|---|---|
| VARIABLE NAME | x4 |
| BIT WIDTH | 4 |
| CONNECTION DESTINATION | INPUT A OF ADDITION 1 |

322

| TYPE | EXTERNAL INPUT VARIABLE |
|---|---|
| VARIABLE NAME | y4 |
| BIT WIDTH | 4 |
| CONNECTION DESTINATION | INPUT B OF ADDITION 1 |

323

| TYPE | ADDITION |
|---|---|
| NAME | ADDITION 1 |
| BIT WIDTH OF INPUT A | 4 |
| CONNECTION SOURCE OF INPUT A | VARIABLE x4 |
| BIT WIDTH OF INPUT B | 4 |
| CONNECTION SOURCE OF INPUT B | VARIABLE y4 |
| OUTPUT BIT WIDTH | 5 |
| CONNECTION DESTINATION | VARIABLE z5 |

324

| TYPE | INTERMEDIATE VARIABLE |
|---|---|
| VARIABLE NAME | z5 |
| BIT WIDTH | 5 |
| CONNECTION SOURCE | OUTPUT OF ADDITION 1 |
| CONNECTION DESTINATION | INPUT A OF ADDITION 2 |

325

| TYPE | EXTERNAL INPUT VARIABLE |
|---|---|
| VARIABLE NAME | x8 |
| BIT WIDTH | 8 |
| CONNECTION DESTINATION | INPUT B OF ADDITION 2 |

326

| TYPE | ADDITION |
|---|---|
| NAME | ADDITION 2 |
| BIT WIDTH OF INPUT A | 5 |
| CONNECTION SOURCE OF INPUT A | VARIABLE z5 |
| BIT WIDTH OF INPUT B | 8 |
| CONNECTION SOURCE OF INPUT B | VARIABLE x8 |
| OUTPUT BIT WIDTH | 9 |
| CONNECTION DESTINATION | VARIABLE z9 |

327

| TYPE | EXTERNAL OUTPUT VARIABLE |
|---|---|
| VARIABLE NAME | z9 |
| BIT WIDTH | 9 |
| CONNECTION SOURCE | OUTPUT OF ADDITION 2 |

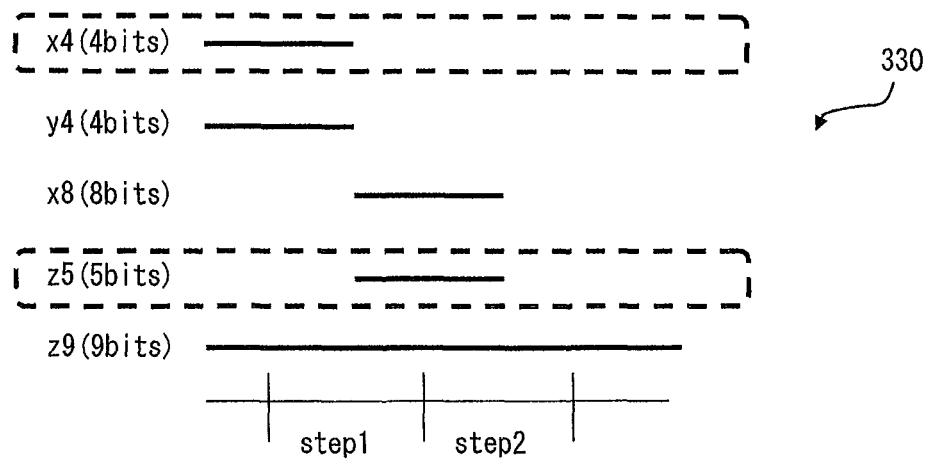
REGISTER ALLOCATION
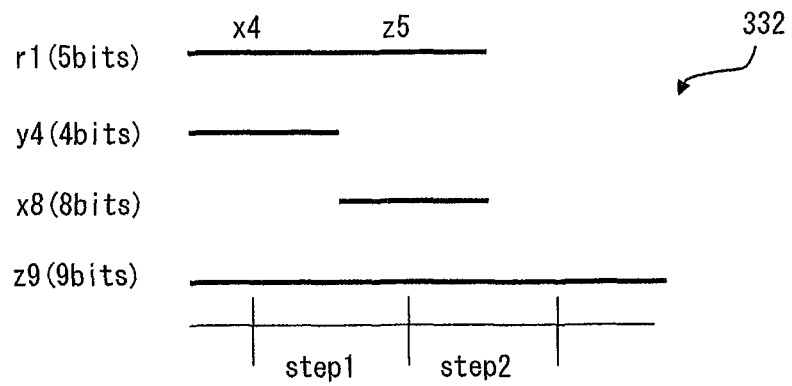
Fig. 10

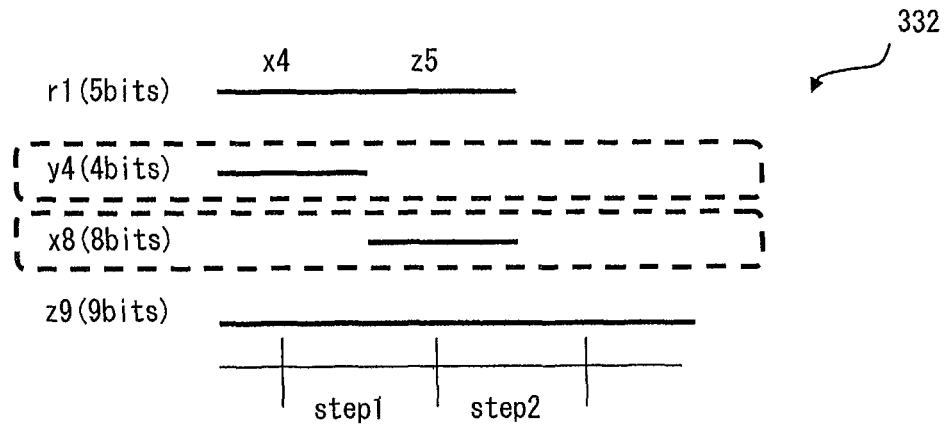
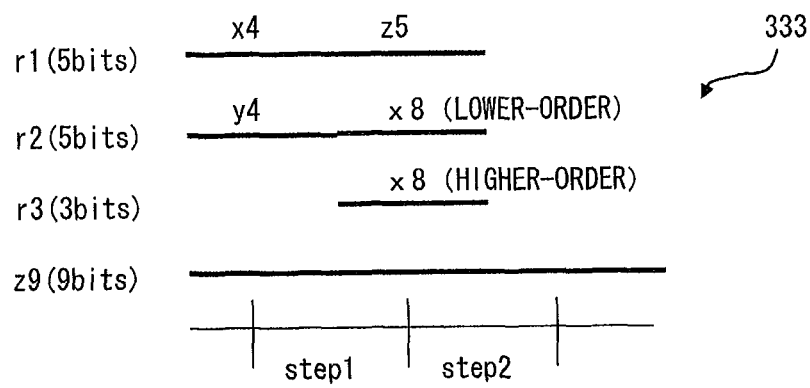
Fig. 11

Fig. 15

```
module top(x4, y4, x8, z9, clock, reset);
  input[3:0] x4;
  input[3:0] y4;
  input[7:0] x8;
  output[8:0] z9;
  input clock;
  input reset;
  wire s1;
  wire s2;

datapath DP(.x4(x4), .y4(y4), .x8(x8), .z9(z9), .s1(s1), .s2(s2), .clock(clock), .reset(reset));   ←501a
  controller CNT(.s1(s1), .s2(s2), .clock(clock), .reset(reset));   ←501b
endmodule
```
501

```
module controller(s1, s2, clock, reset);
  output s1;
  output s2;
  input clock;
  input reset;
  reg r5;
  wire r5w;

assign r5w = ~r5;        ←502b
  assign s1 = r5w;         ←502a
  assign s2 = r5;

always @ (posedge clock or reset)
  begin
    if(reset) r5 <= 1'b0;              ⎫
    else r5 <= r5w;                    ⎬ 502c
  end                                  ⎭
endmodule
```
502

```
module datapath(x4, y4, x8, z9, s1,
s2, clock, reset);
  input[3:0] x4;
  input[3:0] y4;         } 503a
  input[7:0] x8;
  output[8:0] z9;
  input s1;
  input s2;
  input clock;
  input reset;
  reg[4:0] r1;
  reg[4:0] r2;
  reg[2:0] r3;
  reg[8:0] r4;
  wire[4:0] r1w;
  wire[4:0] r2w;
  wire[2:0] r3w;
  wire[8:0] r4w;
  wire[4:0] z5;
  wire[8:0] add_out;
  wire[4:0] add_in_A;
  wire[7:0] add_in_B;

assign add_out = add_in_A + add_in_B;
  assign add_in_A = r1;                    } 503c
  assign add_in_B = {r3, r2};

always @ (posedge clock or reset)
  begin
    if(reset) r1 <= 5'b00000;
    else r1 <= r1w;
  end always @ (posedge clock or reset)
  begin
    if(reset) r2 <= 5'b00000;
    else r2 <= r2w;
  end                                      } 503d always @ (posedge clock or reset)
  begin
    if(reset) r3 <= 3'b000;
    else r3 <= r3w;
  end always @ (posedge clock or reset)
  begin
    if(reset) r4 <= 9'b000000000;
    else r4 <= r4w;
  end case ({s1, s2}) begin
    2'b10: r1w = {1'b0, x4};
    2'b01: r1w = z5;
    default: r1w = 5'bxxxxx;
  end case ({s1, s2}) begin
    2'b10: r2w = {1'b0, y4};
    2'b01: r2w = x8[4:0];                  } 503e
    default: r2w = 5'bxxxxx;
  end case ({s1, s2}) begin
    2'b10: r3w = r3;
    2'b01: r3w = x8[7:5];
    default: r3w = 3'bxxx;
  end case ({s1, s2}) begin
    2'b10: r4w = add_out;
    2'b01: r4w = r4;
    default: r4w = 9'bxxxxxxxxx;
  end endmodule
```
} 503

Fig. 16

BEHAVIORAL SYNTHESIS METHOD, BEHAVIORAL SYNTHESIS PROGRAM AND BEHAVIORAL SYNTHESIS APPARATUS

CROSS-REFERENCE TO RELATED APPLICATIONS

This application is based upon and claims the benefit of priority from Japanese patent application No. 2011-252263, filed on Nov. 18, 2011, the disclosure of which is incorporated herein in its entirety by reference.

BACKGROUND

The present invention relates to a behavioral synthesis method, a behavioral synthesis program and a behavioral synthesis apparatus, and in particular, a behavioral synthesis method, a behavioral synthesis program and a behavioral synthesis apparatus for behavioral-synthesizing a behavioral description describing operation behavior of variables.

In recent years, LSIs are becoming larger and larger in scale. As a result, it has been desired to develop more efficient design methods and design tools. Accordingly, for the functional designing of LSIs, a technique for behavioral-synthesizing a behavioral description, which is a description in a behavioral level, and thereby generating an RTL description, which is a description in a register-transfer level, has been known. In the behavioral synthesis, only the behavior is described by using a language resembling the C language without giving any consideration to circuit elements. Therefore, the circuit designing becomes easier and the design period can be reduced.

As a related-art behavioral synthesis method, "High-level synthesis" Yusuke Matsuyama, which is laid open in the Internet "<URL:http://www.c.csce.kyushu-u.ac.jp/~matsunaga/lecture/lsic ad/pdf/Lecture06.pdf>", discloses such a behavioral synthesis method. FIG. 28 shows a related-art behavioral synthesis method disclosed in the literature written by Yusuke Matsuyama.

As shown in FIG. 28, in the related-art behavioral synthesis method 900, a behavioral description describing the behavior of a circuit (901) is input to an HDL compiler. Then, the HDL compiler analyzes this behavioral description (902) and converts the behavioral description into an internal expression (903). As this internal expression, a control data flow graph (CDFG: Control Data Flow Graph) expressing a flow of data that appear in the behavioral description (data flow) and a flow of control for the execution order of each operation (control flow) is used.

For the generated internal expression, scheduling is performed (904). In the scheduling, specific control steps with which respective operations and/or data transfers in the behavioral description are executed are determined. Further, allocation is performed for the scheduled internal expression (905). In the allocation, a circuit configuration for achieving a desired behavior is determined.

When the scheduling and the allocation have been finished, a net list of a data paths (908) in which registers, functional units, multiplexers, and the like are used as circuit elements, and a control circuit table (907) indicating information about signals used to control behavior to be executed at each clock and state transitions for successive executions are generated (906).

FIGS. 29A, 29B and 29C show an example of an allocation process performed in the related-art behavioral synthesis method disclosed in the literature written by Yusuke Matsuyama.

In the related-art behavioral synthesis method, when a CDFG is generated based on a behavioral description and scheduling is performed, a post-scheduling CDFG like the one shown in FIG. 29A is generated. As a result, in the related-art behavioral synthesis method, registers are allocated to variables a, b, c, d and e, and adders are allocated to additions o1 and o2 by the allocation process.

In general, in the allocation process, "register sharing" in which a plurality of valuables are assigned to a common register is implemented in order to reduce the circuit size. FIGS. 29B and 29C are examples in which allocation is performed while sharing a register(s).

In the example shown in FIG. 29A, the variables a and b and an adder are simultaneously used and the variables d and c and another adder are simultaneously used. However, the other combinations are not simultaneously used. Therefore, in FIG. 29B, the variables a, d and e share a register r1, and registers r2 and r3 are allocated to the variables b and c respectively. Further, a multiplexer is allocated in order to select the value to be input to the shared adder.

Further, in FIG. 29C, the variables a and e share a register r1, and the variables b and d share a register r2. A register r3 is allocated to the variable c. Further, two multiplexers are allocated in order to select the shared register and the value to be input to the adder.

FIGS. 30A, 30B and 30C show an example of register sharing implemented in the related-art behavioral synthesis method disclosed in the literature written by Yusuke Matsuyama. Similarly to FIG. 29A, FIG. 30A shows a post-scheduling CDFG.

In the related-art behavioral synthesis method, when a post-scheduling CDFG is generated, the lifetime of each variable is calculated as shown in FIG. 30B. The lifetime is a period between when a value is written into a variable and when the value is used. That is, the lifetime is a period during which the value needs to be held in the variable.

In the example shown in FIG. 30B, the lifetime of the variable a starts at a time earlier than the step 1 and continues to the step 2. The lifetime of the variable b starts at a time earlier than the step 1 and continues to the step 1. The lifetime of the variable c starts at the step 1 and continues to the step 2. The lifetime of the variable d starts at the step 2 and continues to a time later than the step 2. Any variables whose lifetimes do not overlap each other can be assigned to the same register and thus that register can be shared.

In the related-art behavioral synthesis method, the variables a, b, c and d are sorted (arranged) according to the start times of their lifetimes as shown in FIG. 30C, and then the first variable is assigned to the first register. After that, variables are examined one by one and they are assigned to that register unless their lifetimes do not overlap each other. When no variable can be assigned to that register any more, a new register is prepared. Further, these processes are repeated until all the variables are assigned. In the example shown in FIG. 30C, firstly, since the lifetimes of the variables a and d do not overlap each other, a register r1 is allocated to and shared between them. Further, since the lifetimes of the variables b and c do not overlap each other, a register r2 is allocated to and shared between them.

Further, Japanese Patent No. 2861994 discloses a related-art behavioral synthesis method relating to the register sharing. FIGS. 31A and 31B show an example of register sharing in the related-art behavioral synthesis method disclosed in Japanese Patent No. 2861994.

FIGS. 31A and 31B show an example in which when variables a1 and b1 are to be transferred to registers c1 and c2 respectively, one register (five bits) is used as both the register c1 and the register c2. In FIG. 31A, when a 2-bit signed variable a1 and a 4-bit signed variable b1 are to be transferred to the common register (five bits), a number of bits by which the registers a1 and b1 are short in comparison to the destination register are added to the registers a1 and b1 respectively. Then, the variable to be transferred to the register is selected by a multiplexer (MUX). Note that since the 0th-bit of each of the variables a1 and b1 is a sign bit, the same data as the sign bit is inserted as the bit(s) to be added.

In FIG. 31B, when a 4-bit unsigned variable a2 and a 2-bit unsigned variable b2 are to be transferred to the common register (five bits), a number of bits by which the registers a2 and b2 are short in comparison to the destination register are added to the registers a2 and b2 respectively as in the case of the signed variables. Then, the variable to be transferred to the register is selected by the multiplexer (MUX). Note that since each of the variables a2 and b2 does not have the sign bit, data "0" is inserted as the as the bit(s) to be added.

Further, Japanese Unexamined Patent Application Publication No. 2011-34517 also discloses a technique related to the related-art behavioral synthesis method. However, Japanese Unexamined Patent Application Publication No. 2011-34517 discloses a technique relating to a verification method for verifying the result of behavioral synthesis, but does not disclose any specific behavioral synthesis method.

SUMMARY

As described above, Japanese Patent No. 2861994 and Japanese Unexamined Patent Application Publication No. 2011-34517 disclose that a register(s) is shared when allocation is performed in a related-art behavioral synthesis method.

In particular, as shown in FIGS. 31A and 31B, in the related-art behavioral synthesis method, register sharing is implemented in such a manner that the higher-order bit(s) of a variable having a smaller bit width is filled up with additional data to make the number of bits of that variable equal to that of a variable having a larger bit width, so that a register can be shared between variables having different bit widths. That is, in FIG. 31A, the higher bits of the variable a1 having the smaller bit width is sign-extended to make the number of bits of the variable a1 equal to that of the variable b1 having the larger bit width. Further, in FIG. 31B, the higher bits of the variable b2 having the smaller bit width is filled up with "0" to make the number of bits of the variable b2 equal to that of the variable a2 having the larger bit width. By doing so, the register is shared between the variables.

As a result, there are wasteful unused bits in this shared register as viewed from the variable having a smaller bit width.

Accordingly, in the related-art behavioral synthesis method, since a register is shared according to the bit width of the variable having a larger bit width, unused bits are undesirably generated for the variable having a smaller bit width. Therefore, there has been a problem that the number of bits of the shared register is wastefully large.

A behavioral synthesis method according to an aspect of the present invention includes: creating data flow graph information that is obtained by scheduling a timing of operation behavior of variables based on behavioral description information including the operation behavior of the variables; generating lifetime information for each of the variables based on the scheduled data flow graph information, the lifetime information being a period during which data needs to be held in the variable; selecting m variables (m is integer no less than two) whose lifetimes do not overlap on a time axis; allocating a first register having a first bit width to a first variable included in the m variables and bits of the first bit width within another variable included in the m variables, the first variable being defined to have the first bit width; allocating a second register to bits other than the bits of the first bit width within the another variable; and outputting circuit information of a synthesized circuit including the first and second registers.

A behavioral synthesis method according to another aspect of the present invention includes: creating data flow graph information that is obtained by scheduling a timing of operation behavior of variables from behavioral description information including the operation behavior of the variables; generating lifetime information for each of the variables from the scheduled data flow graph information, the lifetime information being a period during which data needs to be held in the variable; selecting first and second variables whose lifetimes do not overlap on a time axis, the first variable being defined to have a first bit width; allocating a first register having the first bit width to the first variable and bits of the first bit width included in the second variable; allocating a second register to bits other than the bits of the first bit width included in the second variable; and outputting circuit information of a synthesized circuit including the first and second registers.

A behavioral synthesis program according to another aspect of the present invention is a behavioral synthesis program that causes a computer to execute behavioral synthesis processing, the behavioral synthesis processing including: creating data flow graph information that is obtained by scheduling a timing of operation behavior of variables based on behavioral description information including the operation behavior of the variables; generating lifetime information for each of the variables based on the scheduled data flow graph information, the lifetime information being a period during which data needs to be held in the variable; selecting m variables (m is integer no less than two) whose lifetimes do not overlap on a time axis; allocating a first register having a first bit width to a first variable included in the m variables and bits of the first bit width within another variable included in the m variables, the first variable being defined to have the first bit width; allocating a second register to bits other than the bits of the first bit width within the another variable; and outputting circuit information of a synthesized circuit including the first and second registers.

A behavioral synthesis apparatus according to another aspect of the present invention includes: scheduling unit that creates data flow graph information that is obtained by scheduling a timing of operation behavior of variables based on behavioral description information including the operation behavior of the variables; a lifetime generation unit that generates lifetime information for each of the variables based on the scheduled data flow graph information, the lifetime information being a period during which data needs to be held in the variable; a variable select unit that selects m variables (m is integer no less than two) whose lifetimes do not overlap on a time axis; a register allocation unit that allocates a first register having a first bit width to a first variable included in the m variables and bits of the first bit width within another variable included in the m variables and allocates a second register to bits other than the bits of the first bit width within the another variable, the first variable being defined to have the first bit width; and a circuit information output unit that outputs circuit information of a synthesized circuit including the first and second registers.

In the present invention, since a register is allocated to and shared between a first variable having a first bit width and bits of the first bit width within another variable (second variable), the bit width of the shared register can be reduced.

According to the present invention, it is possible to provide a behavioral synthesis method, a behavioral synthesis program, and a behavioral synthesis apparatus, capable of reducing the bit width of a shared register(s).

BRIEF DESCRIPTION OF THE DRAWINGS

The above and other aspects, advantages and features will be more apparent from the following description of certain embodiments taken in conjunction with the accompanying drawings, in which:

FIG. 7 is a diagram showing a specific example of data structure used in a behavioral synthesis method according to a first embodiment of the present invention;

FIG. 10 is a diagram showing a specific example for explaining a behavioral synthesis method according to a first embodiment of the present invention;

FIG. 11 is a diagram showing a specific example for explaining a behavioral synthesis method according to a first embodiment of the present invention;

FIG. 15 is a diagram showing a description of an RTL generated by a behavioral synthesis method according to a first embodiment of the present invention;

FIG. 16 is a diagram showing a description of an RTL generated by a behavioral synthesis method according to a first embodiment of the present invention;

DETAILED DESCRIPTION

[First Embodiment of the Invention]

A first embodiment according to the present invention is explained hereinafter with reference to the drawings.

Figure 1:
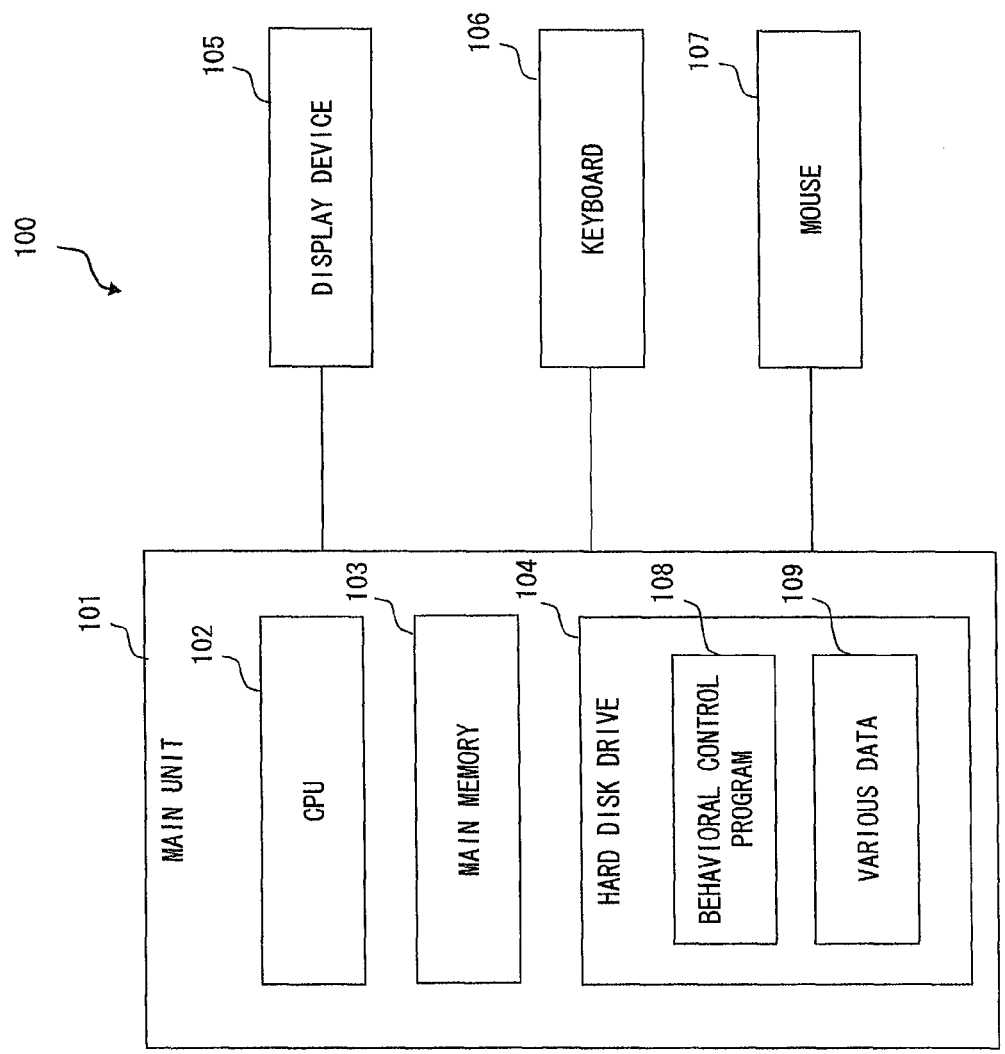
FIG. 1 is a configuration diagram showing a hardware configuration of a computer system for implementing a behavioral synthesis apparatus according to a first embodiment of the present invention.

FIG. 1 shows a hardware configuration of a computer system for implementing a behavioral synthesis apparatus according to a first embodiment of the present invention. Note that a behavioral synthesis apparatus can be also implemented by a computer system similar to the one shown in FIG. 1 in other embodiments described later.

This computer system 100 may be an information processing apparatus such as a personal computer and a workstation. As shown in FIG. 1, the computer system 100 includes a main unit 101 including a CPU 102, a main memory 103, a hard disk drive 104, and the like, and a display device 105 that displays images on a screen under instructions from the main unit 101, a keyboard 106 that is used to enter user's instructions and/or textual information to this computer system, and a mouse 107 that is used to specify an arbitrary point on the screen of the display device and to enter an instruction according to an icon or the like displayed at that point.

Note that the CPU 102 and the main memory 103 are one example of a control unit that executes a program and controls various units, and the hard disk drive 104 is one example of a storage unit that stores a program and the like. The control unit and the storage unit may be formed as a single apparatus or may be formed by a plurality of apparatuses. For example, they may be formed as a distributed system composed of a plurality of control devices and a plurality of storages devices. Further, the display device 105 is one example of an output device that outputs data in various formats for a user, and the keyboard 106 and the mouse 107 are one example of an input device with which a user performs various input operations.

The hard disk drive 104 stores a behavioral synthesis program 108 for implementing a behavioral synthesis apparatus according to this embodiment and other various data 109 necessary for the behavioral synthesis processing and the like. The behavioral synthesis program 108 is a computer program that is used to execute processes of a behavioral synthesis method that are explained layer with reference to FIGS. 4 and 5, and the various data 109 are data stored in various storage units that are explained later with reference to FIG. 2.

The program can be stored and provided to a computer using any type of non-transitory computer readable media. Non-transitory computer readable media include any type of tangible storage media. Examples of non-transitory computer readable media include magnetic storage media (such as floppy disks, magnetic tapes, hard disk drives, etc.), optical magnetic storage media (e.g. magneto-optical disks), CD-ROM (compact disc read only memory), CD-R (compact disc recordable), CD-R/W (compact disc rewritable), and semiconductor memories (such as mask ROM, PROM (programmable ROM), EPROM (erasable PROM), flash ROM, RAM (random access memory), etc.). The program may be provided to a computer using any type of transitory computer readable media. Examples of transitory computer readable media include electric signals, optical signals, and electromagnetic waves. Transitory computer readable media can provide the program to a computer via a wired communication line (e.g. electric wires, and optical fibers) or a wireless communication line.

The computer system 100 loads the behavioral synthesis program 108 and the various data 109 into the main memory 103 and the CPU 102 executes the behavioral synthesis program 108 loaded in the main memory 103, so that each process of the behavioral synthesis method according to this embodiment is performed and a behavioral synthesis apparatus (functional configuration described later with reference to FIGS. 2 and 3) is thereby implemented. Note that the fundamental operation of the computer system 100 is performed through an operating system (OS), which is the fundamental program stored in the hard disk drive 104.

Figure 2:
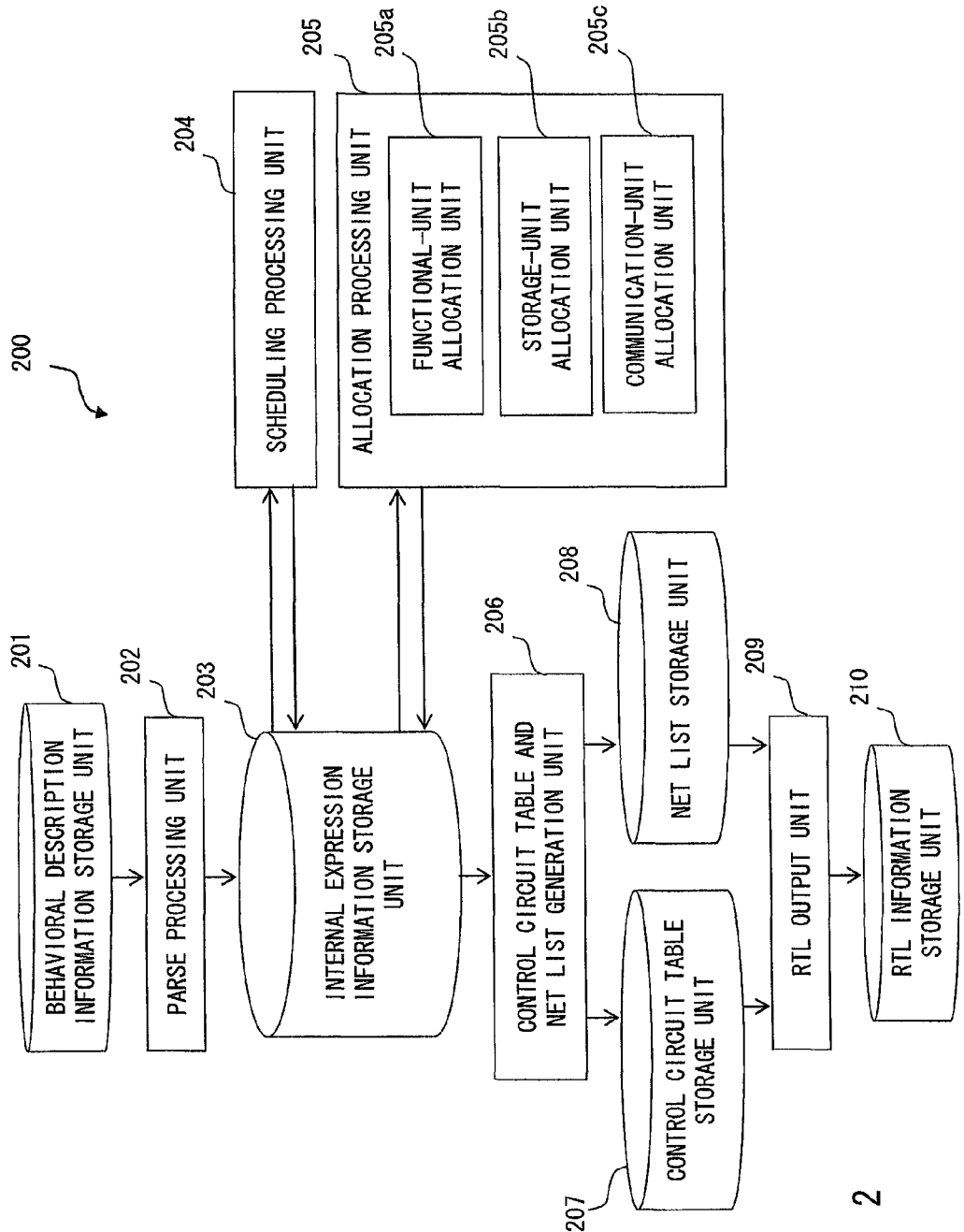
FIG. 2 is a block diagram showing a functional configuration of a behavioral synthesis apparatus according to a first embodiment of the present invention.

FIG. 2 shows a functional configuration of a behavioral synthesis apparatus according to the first embodiment of the present invention. This behavioral synthesis apparatus 200 is implemented by executing a behavioral synthesis program on the computer system 100.

As shown in FIG. 2, this behavioral synthesis apparatus 200 includes a behavioral description information storage unit 201, a parse processing unit 202, an internal expression information storage unit 203, scheduling processing unit 204, allocation processing unit 205, a control circuit table and net list generation unit 206, a control circuit table storage unit 207, a net list storage unit 208, an RTL output unit 209, and an RTL information storage unit 210.

The behavioral description information storage unit 201 stores behavioral description information, which is data expressing a behavioral description described in a behavioral description language. The behavioral description is described by a behavioral description language that is created by extending the C language for a hardware description, such as the System C. For example, the behavioral description information is entered by a user through the keyboard 106 or the like and stored in the behavioral description information storage unit 201.

The parse processing unit 202 parses (converts) the behavioral description information based on the behavioral description stored in the behavioral description information storage unit 201 and thereby generates internal expression information expressing a CDFG, which is an internal expression.

The internal expression information storage unit 203 stores the internal expression information generated by the parse processing unit 202. Further, the internal expression information storage unit 203 also stores a post-scheduling CDFG data and a post-allocation CDFG data, which are results of the processes performed for the internal expression information by the scheduling processing unit 204 and the allocation processing unit 205.

The scheduling processing unit 204 schedules control steps with which respective operations are executed for the internal expression information generated by the parse processing unit 202 based on this internal expression information and thereby generates post-scheduling internal expression information.

The allocation processing unit 205 allocates a function unit(s), a storage unit(s), and a communication unit(s) for the post-scheduling internal expression information generated by the scheduling processing unit 204 based on this internal expression information and thereby generates post-allocation internal expression information.

Further, the allocation processing unit 205 includes a functional-unit allocation unit 205*a* that allocates a functional unit(s) such as an adder, a storage-unit allocation unit 205*b* that allocates a storage unit(s) such as a register, and a communication-unit allocation unit 205*c* that allocates a communication unit(s) such as a multiplexer.

The control circuit table and net list generation unit 206 generates a control circuit table by specifying an object(s) to be controlled by the control circuit, a control timing(s), and the like from the post-scheduling and post-allocation internal expression information generated by the scheduling processing unit 204 and the allocation processing unit 205 based on this internal expression information, and generates a net list by specifying each circuit element on a data path(s) and their connection relation from this internal expression information.

The control circuit table storage unit 207 stores the control circuit table generated by the control circuit table and net list generation unit 206. The net list storage unit 208 stores the net list generated by the control circuit table and net list generation unit 206.

The RTL output unit 209 generates RTL information of a synthesized circuit that is obtained by combining the control circuit corresponding to the control circuit table and the data path of the net list generated by the control circuit table and net list generation unit 206, based on the control circuit table and the net list of the data path, and outputs the generated RTL information.

The RTL information storage unit 210 stores the RTL information output by the RTL output unit 209. The RTL information is RTL data described by a hardware description language such as the VHDL (Very High Speed Integrated Circuits Hardware Description Language).

Figure 3:
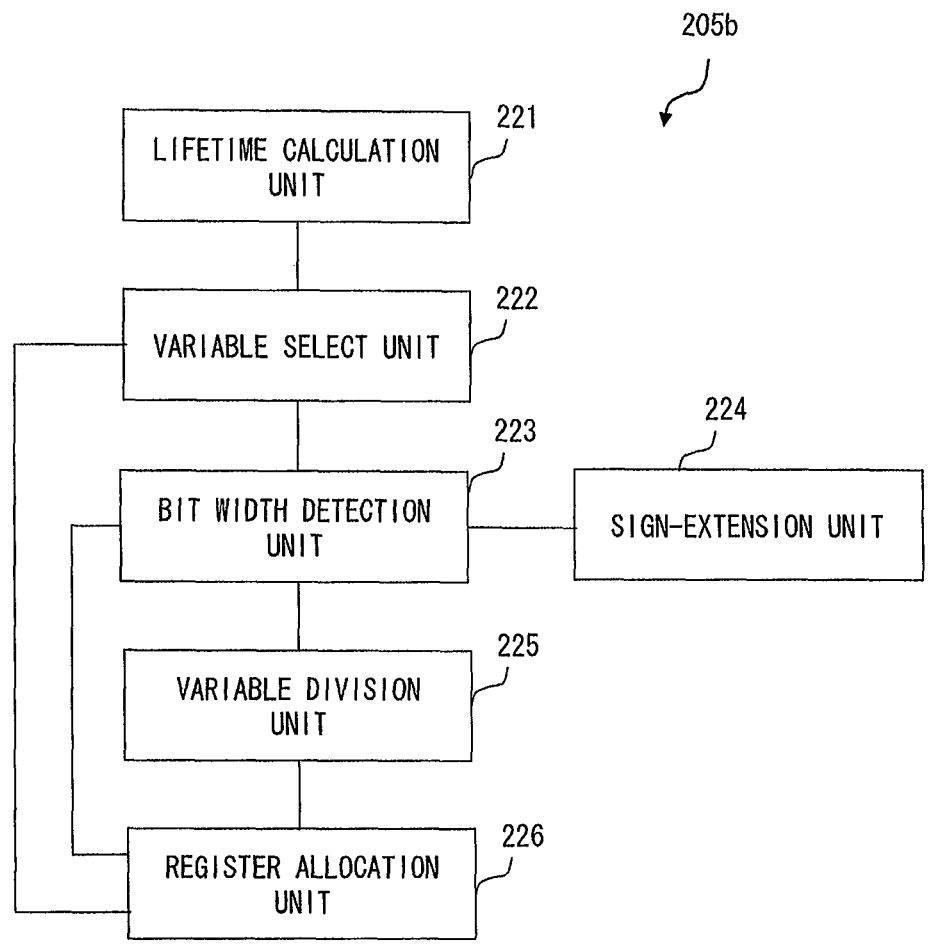
FIG. 3 is a block diagram showing a functional configuration of a storage-unit allocation unit according to a first embodiment of the present invention.

FIG. 3 shows a functional configuration of a storage-unit allocation unit according to the first embodiment of the present invention. This storage-unit allocation unit 205b is included in the allocation processing unit 205 shown in FIG. 2.

As shown in FIG. 3, the storage-unit allocation unit 205b includes a lifetime calculation unit 221, a variable select unit 222, a bit width detection unit 223, a sign extension unit 224, a variable division unit 225, and a register allocation unit 226.

The lifetime calculation unit 221 obtains a variable(s) to be used in each control step based on the post-scheduling internal expression information (DCFG) scheduled by the scheduling processing unit 204, and calculates a lifetime for each variable.

The variable select unit 222 determines whether or not the lifetime of each variable overlaps on the time axis (control steps) based on the lifetimes calculated by the lifetime calculation unit 221, and selects two variables whose lifetimes do not overlap each other.

The bit width detection unit 223 detects bit widths of the two variables selected by the variable select unit 222, and thereby determines whether or not their bit widths are different. Further, the bit width detection unit 223 also determines whether or not the bit widths of variables whose signs are extended by the sign extension unit 224 are different.

When the bit width detection unit 223 determines that the bit widths of the two variables are different, the sign extension unit 224 extends the sign of the variable having the smaller bit width by the minimum necessary amount.

When the bit width detection unit 223 determines that the bit widths of the two variables are different, the variable division unit 225 divides the variable having the larger bit width into higher-order bits and lower-order bits according to the bit width of the variable having the smaller bit width.

When the bit width detection unit 223 determines that the bit widths of the two variables are equal to each other, the register allocation unit 226 allocates the same register to these two variables. Further, the register allocation unit 226 allocates the same register to the lower-order bits obtained by the division performed by the variable division unit 225 and the variable having the smaller bit width, and allocates another register to the remaining higher-order bits obtained by the division performed by the variable division unit 225.

An operation of a behavioral synthesis method including the storage-unit allocation method according to the first embodiment of the present invention is explained hereinafter. Firstly, a flow of the behavioral synthesis method is explained by using flowcharts shown in FIGS. 4 and 5. Then, specific examples of the behavioral synthesis method are explained with reference to FIGS. 6 to 16.

Figure 4:
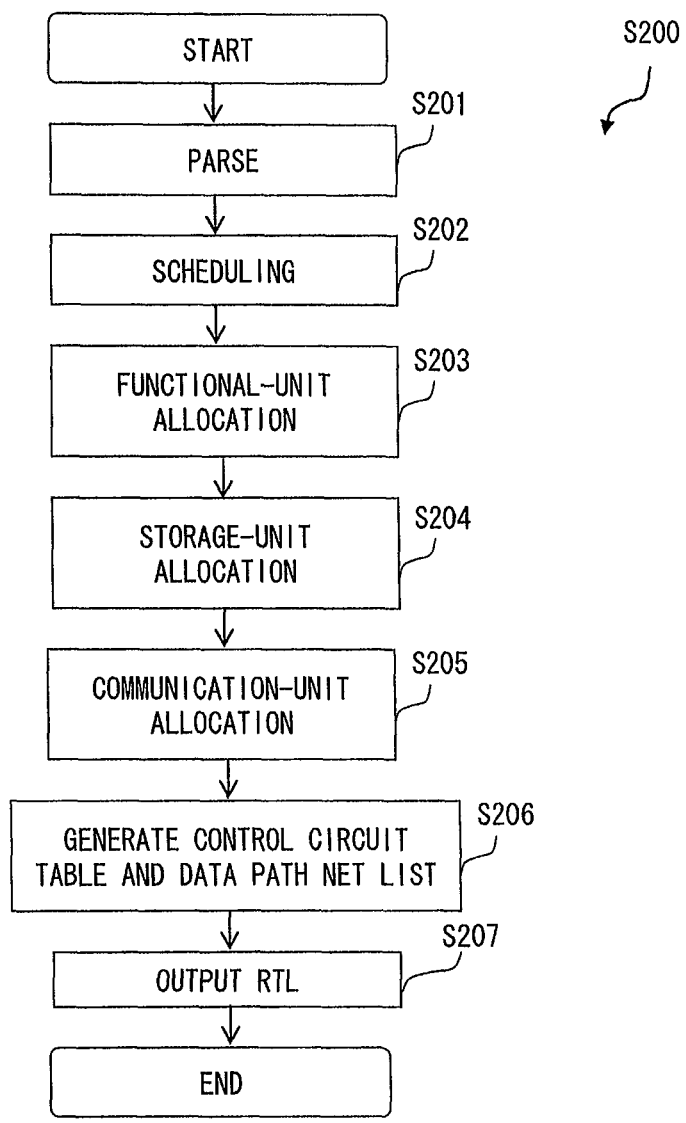
FIG. 4 is a flowchart showing a flow of a behavioral synthesis method according to a first embodiment of the present invention.

As shown in FIG. 4, in the behavioral synthesis method S200 according to this embodiment, firstly, the parse processing unit 202 parses behavioral description information, i.e., entered behavioral description data and thereby generates internal expression information, which is CDFG data (S201).

Next, the scheduling processing unit 204 performs scheduling for the internal expression information generated in the step S201 and thereby generates post-scheduling internal expression information (S202).

Next, the allocation processing unit 205 performs allocation for the post-scheduling internal expression information generated in the step S202 and thereby generates a post-allocation CDFG (S203 to S205). That is, the functional-unit allocation unit 205a allocates a functional unit(s) such as an adder to the internal expression information (S203), and the storage-unit allocation unit 205b allocates a storage unit(s) such as a register to the internal expression information (S204). Further, the communication-unit allocation unit 205c allocates a communication unit(s) such as a multiplexer to the internal expression information (S205).

Note that since the allocations of the functional unit, the storage unit, and the communication unit are related with each other, the order of the allocations may be changed as appropriate. For example, when a register(s) is shared as a result of the storage-unit allocation, the configuration of the register is changed. Therefore, the allocations of the functional unit and the communication unit are also changed.

Next, the control circuit table and net list generation unit 206 generates a control circuit table and a net list of a data path(s) by using the post-scheduling and post-allocation internal expression information generated in the steps S202 to S205 (S206).

Next, the RTL output unit 209 outputs RTL information of a synthesized circuit that is obtained by combining the control circuit and the data path by using the control circuit table and the data path net list generated in the step S206 (S207), and outputs an RTL with which the behavioral synthesis processing has been finished (S207).

Figure 5:
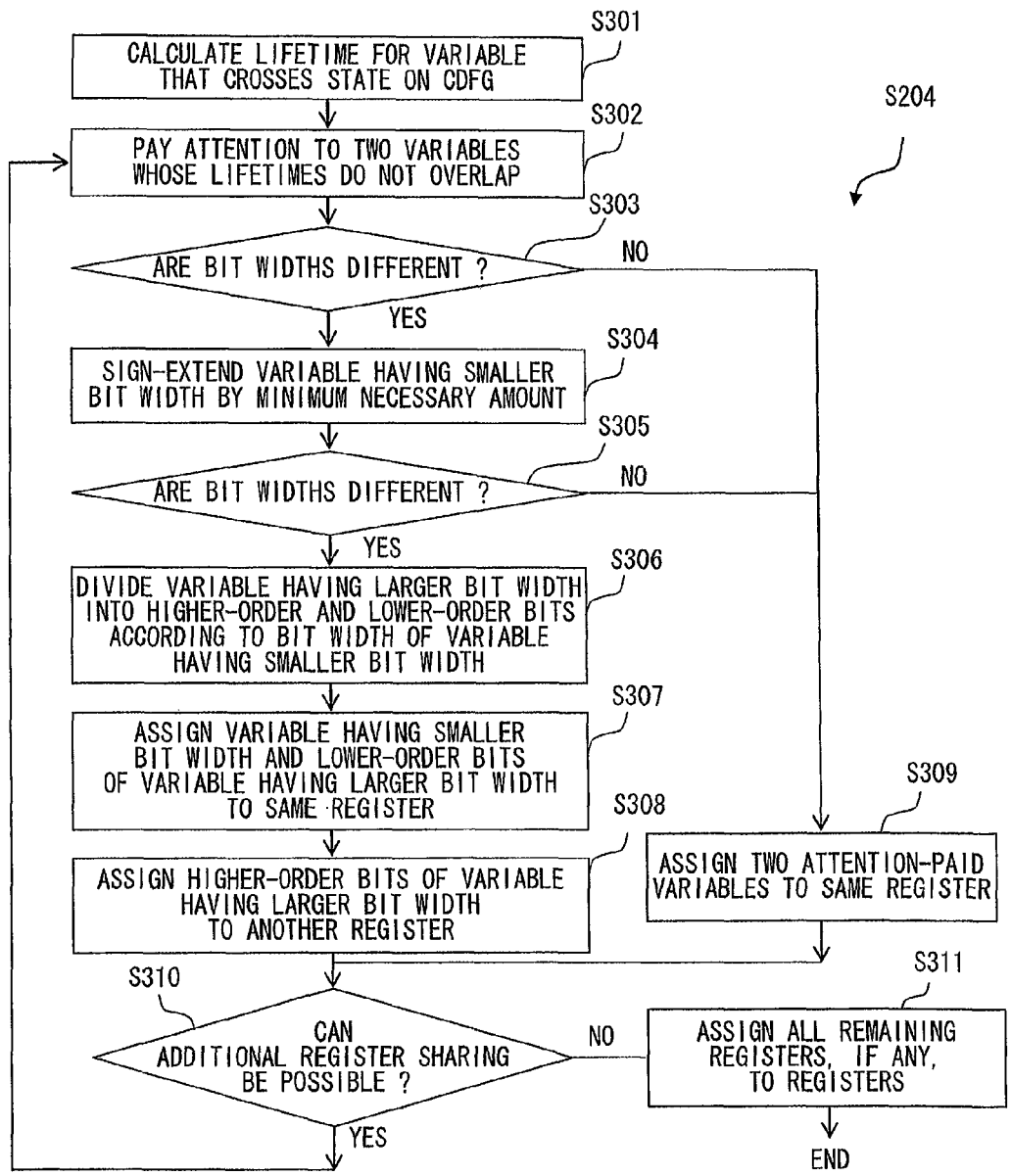
FIG. 5 is a flowchart showing a flow of a storage-unit allocation method according to a first embodiment of the present invention.

Further, as shown in FIG. 5, in the storage-unit allocation process (S204), firstly, the lifetime calculation unit 221 calculates a lifetime for each variable that cuts across a state on the scheduled CDFG (internal expression) (S301). Next, the variable select unit 222 pays attention to two variables that do not overlap each other among a plurality of variables whose lifetimes were calculated in the step S301 (S302). Next, the bit width detection unit 223 determines whether or not the bit widths of the two variables, which have been paid attention in the step S302, are different (S303).

When it is determined that the bit widths are different in the step S303, the sign extension unit 224 sign-extends the variable having the smaller bit width by the minimum necessary amount (S304). Further, the bit width detection unit 223 determines whether or not the bit widths of the two variables, which are sign-extended in the step S304, are different (S305).

Note that the bit width of each variable is defined in advance in the behavioral description information as explained later. When this predefined bit width can be used without performing any additional process, the sign-extension performed in the step S304 and the determination made in the step S305 are unnecessary. For example, for an operation in which a variable having a smaller bit width is input, when the bit width of the input is equal to that of the output, the sign-extension is zero. That is, the bit width is not extended. When this condition can be applied and when the bit widths of variables shared in the step S303 are different, the steps S304 and S305 are unnecessary, making it possible to reduce the bits. Further, when the predefined bit width cannot be used without performing any additional process, the sign-extension is performed in the step S304. Further, the bit widths of the variables to be processed are defined again, and the determination is performed in the step S305. That is, while the predefined bit widths of variables are compared in the step S303, the bit widths of the variables, which are defined again by performing sign-extension, are compared in the step S305.

When it is determined that the bit widths are different after the sign-extension in the step S305, the variable division unit 225 divides the variable having the larger bit width into higher-order bits and lower-order bits according to the bit width of the variable having the smaller bit width (S306).

Next, the register allocation unit 226 assigns the variable having the smaller bit width and the lower-order bits of the divided variable having the larger bit width to the same register (S307). Next, the register allocation unit 226 assigns the higher-order bits of the divided variable having the larger bit width to another register (S308).

When it is determined that the bit widths of the two variables are equal to each other in the step S303 or S305, the register allocation unit 226 assigns the two attention-paid variables to the same register (S309).

After the registers are allocated in the step S308 or S309, the register allocation unit 226 determines whether or not additional register sharing can be implemented (S310). When it is determined that additional register sharing can be implemented in the step S310, the processes at the step S302 and the subsequent steps are repeated to implement additional register sharing. Further, when it is determined that additional register sharing cannot be implemented any more in the step S310, all the remaining variables, if any, are assigned to registers and the allocation process has been thereby finished (S311).

A specific example of the behavioral synthesis method shown in FIGS. 6 to 16 is explained hereinafter in conjunction with each step in FIGS. 4 and 5.

Figure 6:
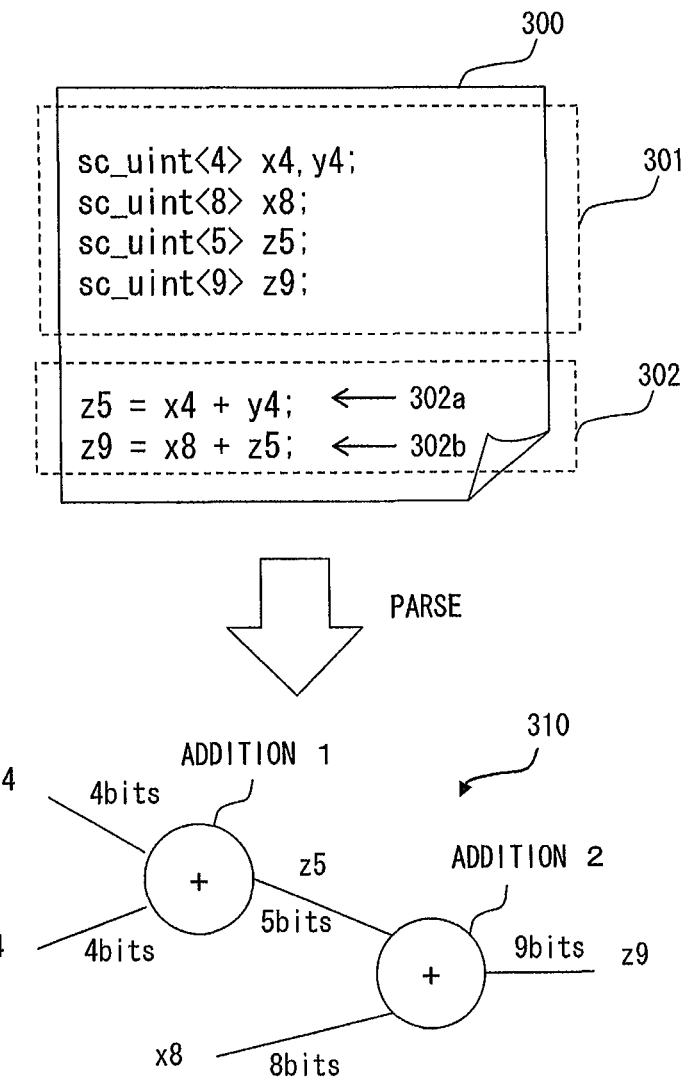
FIG. 6 is a diagram showing a specific example for explaining a behavioral synthesis method according to a first embodiment of the present invention.

Firstly, when the process of the behavioral synthesis method S200 starts, parsing is performed as shown in FIG. 6 (S201). The reference numeral 300 in FIG. 6 is an example of a behavioral description, and the reference numeral 310 in FIG. 6 is a CDFG that is generated by parsing the behavioral description 300 shown in FIG. 6.

As shown in FIG. 6, the behavioral description 300 includes a variable declaration description section 301 and an operation description section 302. Note that the behavioral description information is text data composed of character strings of a behavioral description(s).

In the variable declaration description section 301, a type of a variable, a bit width of the variable, and a name(s) of the variable are described in this order on a line-by-line basis, and the presence/absence of sign information and the bit width are thereby defined for the variable. Note that for each variable, it is necessary to determine the number of bits to be assigned that is necessary to express its possible value in a binary format. In this specification, the number of bits to be assigned that is necessary to express its possible value in a binary format is referred to as "bit width". Therefore, a variable X having an n-bit width (n: integer) means a variable X that can be expressed as an n-bit binary number. As described above, a variable X to which an n-bit width is assigned is referred to as "variable X defined to have an n-bit width".

In this example, each of variables x4 and y4 is declared (defined) as a 4-bit unsigned integer (unit-type) variable, and a variable x8 is an 8-bit unsigned integer variable. Further, a variable z5 is a 5-bit unsigned integer variable and a variable z9 is a 9-bit unsigned integer variable. Note that it is also possible to declare a signed integer (int-type) variable in a similar manner. In such cases, the bits to be defined include a bit(s) indicating sign information (e.g., the highest-order bit).

In the operation description section 302, operations (formulas) that are used to perform arithmetic operations for the variables declared in the variable declaration description section 301 are written. In this example, an operation for inputting a result obtained by adding the variable x4 to the variable y4 into the variable z5 (formula 302a) and an operation for inputting a result obtained by adding the variable x8 to the variable z5 into the variable z9 (formula 302b) are written.

By the variable declaration description section 301 and the operation description section 302, an operation for storing an addition result of a 4-bit variable and a 4-bit variable into a 5-bit variable, and an operation for outputting an addition result of that 5-bit variable and an 8-bit variable as a 9-bit variable are expressed.

As shown in FIG. 6, a CDFG 310, which is obtained by parsing the behavioral description 300, is expressed so as to correspond to the behavioral description in such a manner that an operation is associated with variables used for that operation. Since there is "+" as a operation symbol in the formulas written in the operation description section 302 of the behavioral description 300, a symbol indicating an addition (adder) is connected to and associated with respective variables.

In this example, the operation of an addition 1 corresponds to the formula 302a and thus expresses that the 4-bit variable x4 is added to the 4-bit variable y4 and their result is output to the 5-bit variable z5. Further, the operation of an addition 2 corresponds to the formula 302b and thus expresses that the 5-bit variable z5 is added to the 8-bit variable x8 and their result is output to the 9-bit variable z9. Note that an example for unsigned variables is shown in the above explanation. For the case of signed variables, a CDFG can be also generated in a similar manner by increasing the bit width by the minimum necessary amount.

FIG. 7 shows an example of internal expression information for storing/processing this CDFG as data. This internal expression information 320 is a group of structures expressing variables and nodes (elements) of operations and the like that constitute the CDFG. Each structure includes parameters such as "type", "name" and "bit width", for example, in order to specify the respective node. The structures are categorized into several types according to the "type". In this example, there are four types of structures including "external input variable", "addition", "intermediate variable" and "external output variable". Further, connections among nodes are expressed by providing a field(s) that is used to indicate "connection destination" and/or "connection source" in each structure.

The internal expression information 320 in FIG. 7 expresses each node of the CDFG 310 shown in FIG. 6. A structure 321 expresses a variable x4; a structure 322 expresses a variable y4; a structure 323 expresses an addition 1; a structure 324 expresses a variable z5; a structure 325 expresses a variable x8; a structure 326 expresses an addition 2; and a structure 327 expresses a variable z9.

Figure 8:
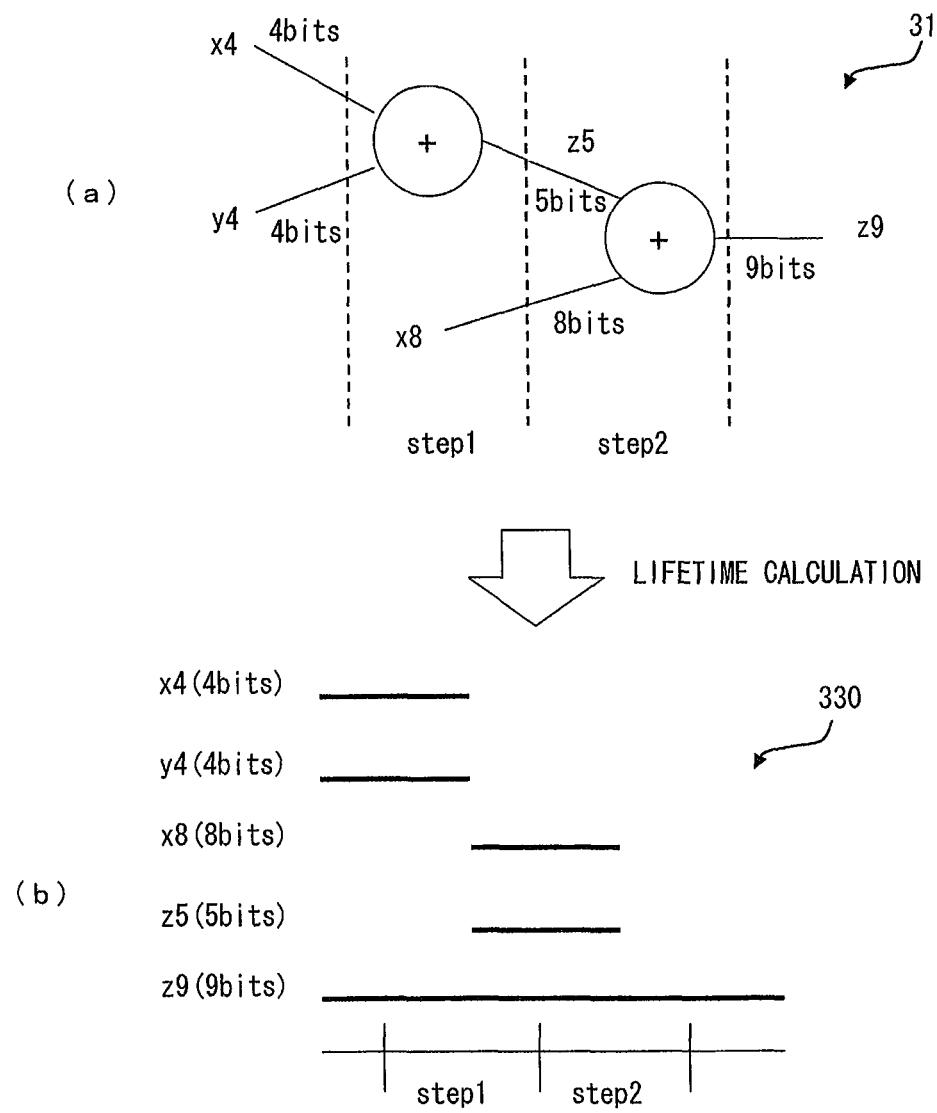
FIG. 8 is a diagram showing a specific example for explaining a behavioral synthesis method according to a first embodiment of the present invention.

After performing the parsing in FIG. 6, scheduling is performed as shown in FIG. 8 (S202). The reference numeral 311 in FIG. 8 is a CDFG that is obtained by performing scheduling for the CDFG 310 shown in FIG. 6.

In the scheduling process, control steps with which respective operation processes are performed are determined according to the order of the respective operation processes. As can be understood from FIG. 6, the addition of the variable x8 and the variable z5 needs to be performed after the addition of the variable x4 and the variable y4. Therefore, two addition processes are performed in two steps.

That is, as the CDFG 311 shown in FIG. 8, the scheduling is made in such a manner that: two additions are separated into different steps; in the step 1, the process of the addition 1 in which the variable x4 and the variable y4 are added and the result is output to the variable z5 is performed; and in the next step 2, the process of the addition 2 in which the variable z5 and the variable x8 are added and the result is output to the variable z9 is performed.

After the scheduling is made as the CDFG 311 in FIG. 8, the allocations in the steps S203 and S204 are performed. In the storage-unit allocation, lifetimes are calculated as the reference numeral 330 shown in FIG. 8. The reference numeral 330 in FIG. 8 is a lifetime table showing the lifetime of each variable of the CDFG 311 scheduled in FIG. 8. Note that in the diagram showing lifetimes, the steps 1 and 2 are mainly illustrated and illustration of the steps before and after these steps are omitted. However, in practice, these steps 1 and 2 are repeated.

In the calculation of lifetimes, it is necessary to calculate, for each variable, the period, i.e., from which control step to which control step, during which the value needs to be held in the variable based on the relations between the control steps and operations and variables expressed by the CDFG.

In this example, since the variable x4 is used as an input to the addition 1 in the step 1 but is not used after the addition 1, its lifetime is from the step preceding the step 1 to the step 1. The variable y4 has the same lifetime as that of the variable x4.

Since the variable x8 is used as an input to the addition 2 in the step 2 but is not used after the addition 2, its lifetime is from the step 1 to the step 2. The value of the variable z5 is determined by the addition 1 performed in the step 1, and the variable z5 is used as an input to the addition 2 in the step 2 but is not used after the addition 2. Therefore, the lifetime of the variable z5 is from the step 1 to the step 2.

The variable z9 is the value in which the final operation result is held. In this example, it is assumed that the variable z9 continuously holds its output value regardless of the state. Therefore, the lifetime of the variable z9 is from the step preceding the step 1 to the step subsequent to the step 2. That is, the lifetime of the variable z9 is the whole period.

Figure 9:
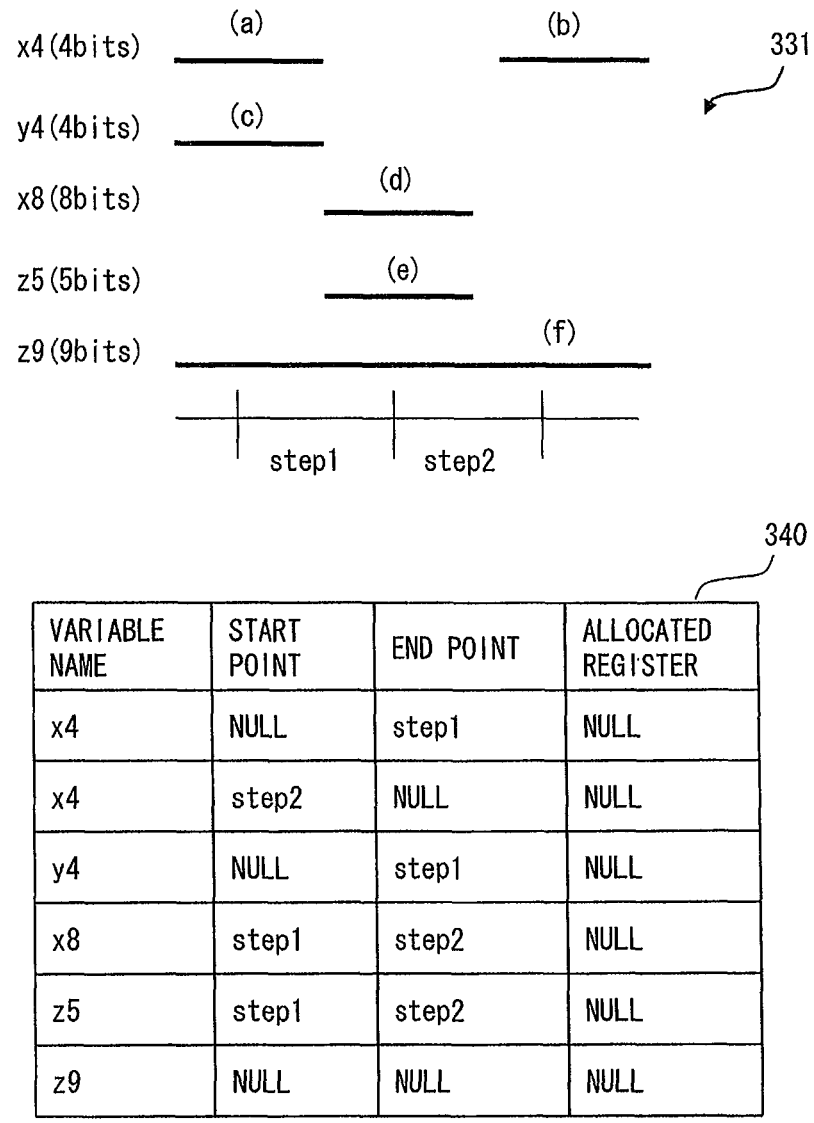
FIG. 9 is a diagram showing a specific example of data structure used in a behavioral synthesis method according to a first embodiment of the present invention.

FIG. 9 shows an example of lifetime information for storing/processing these lifetimes as data. This lifetime information is a table structure 340 expressing the lifetime of each variable. The table structure 340 includes, for example, "variable name", "start point, and "end point" fields to specify the name and the period of the lifetime. Further, the table structure 340 also includes "allocated register" to specify register allocation.

When the "start point" is NULL, it indicates that "the lifetime starts before the initial step (step 1)". Further, when the "end point" is NULL, it indicates that "the lifetime continues after the final step (step 2)" When the "allocated register" is NULL, it indicates that the register to be allocated has not been determined yet. Further, when the register to be allocated is determined, that register is recorded in the "allocated register" field.

A lifetime is recorded for each consecutive period. When one variable has a plurality of lifetimes, a plurality of lifetimes are registered for that variable.

In FIG. 9, the table structure 340 corresponds to a lifetime table 331, and the lifetimes (a) to (f) of the respective variables x4, y4, x8, z5 and z9 are registered in the table structure 340 on a line-by-line basis.

In this table structure 340, the row (a) expresses the first life time of the variable x4; the row (b) expresses the second life time of the variable x4; the row (c) expresses the life time of the variable y4; the row (d) expresses the life time of the variable x8; the row (e) expresses the life time of the variable z5; and the row (f) expresses the life time of the variable z6.

After the lifetimes are calculated by the lifetime table 330 in FIG. 8, attention is paid to two variables as the reference numeral 330 shown in FIG. 10. The reference numeral 330 in FIG. 10 is the same lifetime table as that shown in FIG. 8.

The lifetimes are analyzed from their start points to end points to determine whether or not they overlap each other in each control step. The lifetime table 330 in FIG. 10, firstly, since the lifetimes of the variables z4 and z5 do not overlap, attention is paid to the variables z4 and z5.

After attention is paid to the two variables z4 and z5 in the lifetime table 330 of FIG. 10, their bit widths are compared (S303). Since the bit width of the variable x4 is different from that of the variable z5, the variable x4, which has the smaller bit width, is sign-extended by the minimum necessary amount. As a result, the bit width of the variable x4 becomes five bits (S304).

In this sign-extension, attention is paid to an operation in which the attention-paid variables are used as inputs, and sign-extension is performed according to the bit width of the output of the operation. When the bit width of the input of the operation is equal to that of the output, the sign-extension is unnecessary as described previously. On the other hand, when the bit width of the input of the operation is different from that of the output, the bit width that is obtained by performing sign-extension according to the bit width of the output is re-defined as the bit width of the variable.

For example, when a 4-bit variable x4 is used as an input to an addition operation whose output bit width is five bits, the 4-bit variable x4 is sign-extended by one bit and thereby its bit width becomes five bits. For example, when a 5-bit variable z5 is used as an input to an addition operation whose output bit width is nine bits, the 5-bit variable z5 is sign-extended by four bits and thereby its bit width becomes nine bits.

In general, there is a possibility that an arbitrary value(s) is input to an input(s) other than the input to which the attention-paid variable is input. In consideration of this, assuming a case where zero is input to one of the inputs in the case of addition or subtraction, or a case where one is input to one of the inputs in the case of multiplication, the value of the attention-paid variable is directly reflected in the output of the operation.

In such a case, if the bit width of the attention-paid variable is smaller than the bit width of the output of the operation, the value of the higher-order bit(s) that the bit width of the attention-paid variable lacks become uncertain. Therefore, there is a possibility that an uncertain value (garbage) enters the higher-order bit(s) depending on the connection relation that is formed when the RTL is generated, and thus preventing the correct operation result from being obtained. Therefore, in this embodiment, the number of bits is sign-extended by the necessary amount in advance, and thus making it possible to perform a correct operation.

After the variable x4 is sign-extended in the lifetime table 330 of FIG. 10, the bit widths are compared again (S305). Since the bit width of the extended variable x4 is five bits, i.e., equal to that of the variable z5, the same register is allocated to the two attention-paid variables as the reference numeral 332 shown in FIG. 10 (S309). The reference numeral 332 in FIG. 10 is a lifetime table that is obtained by allocating a register r1 to the variables x4 and z5 for the lifetime table 330 shown in FIG. 10.

That is, the variables x4 and z5, whose lifetimes do not overlap and which have the same bit width, are expressed in such a manner that they are successively aligned in the lifetime table, and a register r1 having a 5-bit width, which is equal to those of the variables x4 and z5, is allocated to these successively-arranged variables x4 and z5.

After the register r1 is allocated in the lifetime table 332 of FIG. 10, it is determined whether or not additional register sharing can be implemented (S310). Since there are still variables whose lifetimes do not overlap, attention is paid to additional two variables as the reference numeral 332 shown in FIG. 11 (S302). The reference numeral 332 in FIG. 11 is the same lifetime table as the lifetime table 332 shown in FIG. 10. In the lifetime table 332 of FIG. 11, since the lifetimes of the variables y4 and x8 do not overlap, attention is paid to the variables y4 and x8.

After attention is paid to the two variables y4 and x8 in the lifetime table 332 of FIG. 11, their bit widths are compared (S303). Further, the variable y4, which has the smaller bit width, is sign-extended by the minimum necessary amount and thus the bit width of the variable y4 becomes five bits (S304). The bit widths are compared again (S305). The bit width of the extended variable y4 is five bits and the bit width of the variable x8 is eight bits, and thus their bit widths are different. Therefore, as the reference numeral 333 shown in FIG. 11, the variable x8, which has the lager bit width, is divided (S306). Then, the same register r2 is allocated to the variable y4 having the smaller bit width and the lower-order bits of the divided variable x8 (S307). Further, another register r3 is allocated to the higher-order bits of the divided variable x8 (S308). The reference numeral 333 in FIG. 11 is a lifetime table that is obtained by allocating registers r2 and r3 to the variables y4 and x8 in the lifetime table 332 shown in FIG. 11.

That is, since the lifetimes of the variables y4 and x8 do not overlap and the variables y4 and x8 have different bit widths, the variable x8 having the larger bit width is divided into the higher-order three bits and the lower-order five bits. The variable y4 having the smaller bit width and the lower-order five bits of the variable x8 are expressed in such a manner that they are successively aligned in the lifetime table, and a 5-bit register r2 is allocated to these successively-arranged variable y4 and the lower-order bits of the variable x8. Further, a register r3 is allocated to the higher-order bits of the variable x8.

After the registers r2 and r3 are allocated in the lifetime table 333 of FIG. 11, it is determined whether or not additional register sharing can be implemented (S310). Since there are no variables whose lifetimes do not overlap, attention is paid to the remaining variable z9 as the reference numeral 333 shown in FIG. 12. Then, as the reference numeral 334 shown in FIG. 12, a 9-bit register r4 is allocated to the remaining variable x9 (S311).

Figure 12:
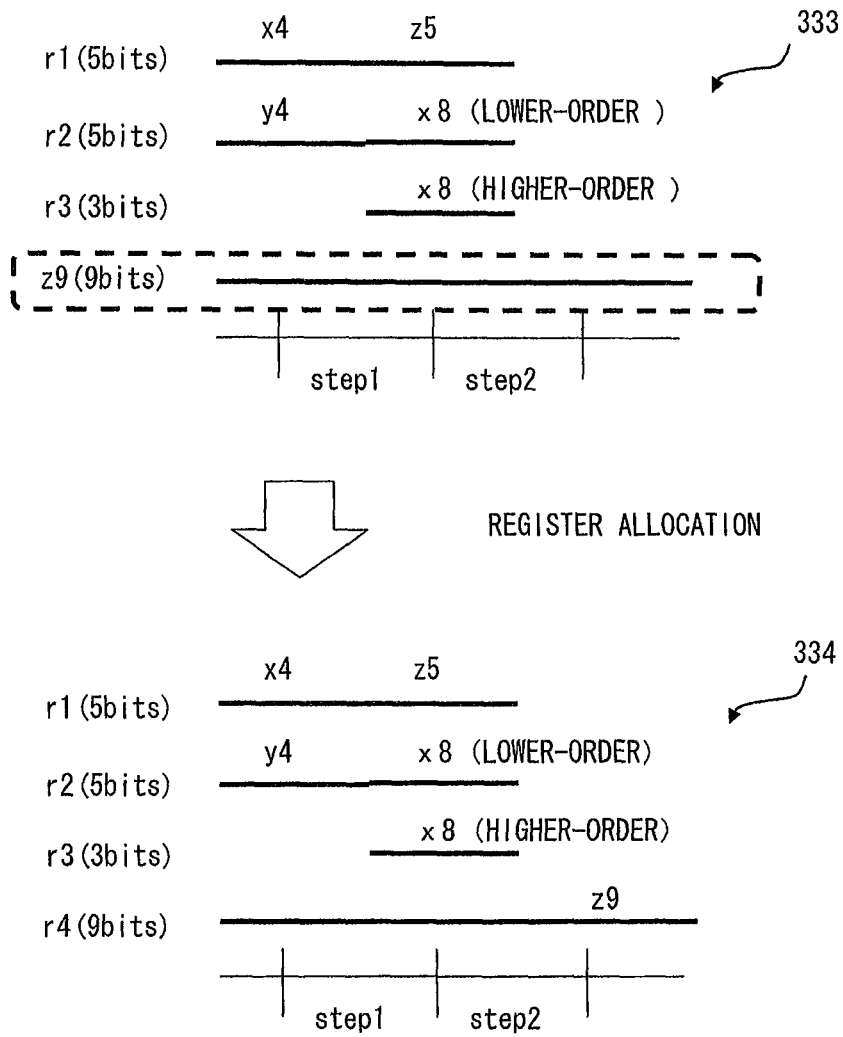
FIG. 12 is a diagram showing a specific example for explaining a behavioral synthesis method according to a first embodiment of the present invention.

With the lifetime table 334 in FIG. 12, the register (storage-unit) allocation has been completed. Allocations of an adder (s) (functional unit(s)) and a multiplexer(s) (communication unit(s)) are performed according to this register allocation. Upon completion of these allocations, a net list of a data path(s) like the one shown in FIG. 13 is generated (S206).

The registers r1, r2, r3 and r4, which are allocated based on the lifetime table 334, are connected with an adder A1. In order to switch the variables that are input to the shared registers r1 and r2 according to the control step in the lifetime table 334, multiplexers M1 and M2 are connected to the registers r1 and r2. Further, in order to control the timings at which the variables are input to the registers r3 and r4 according to the control step, multiplexers M3 and M4 are connected to the registers r3 and r4.

Figure 13:
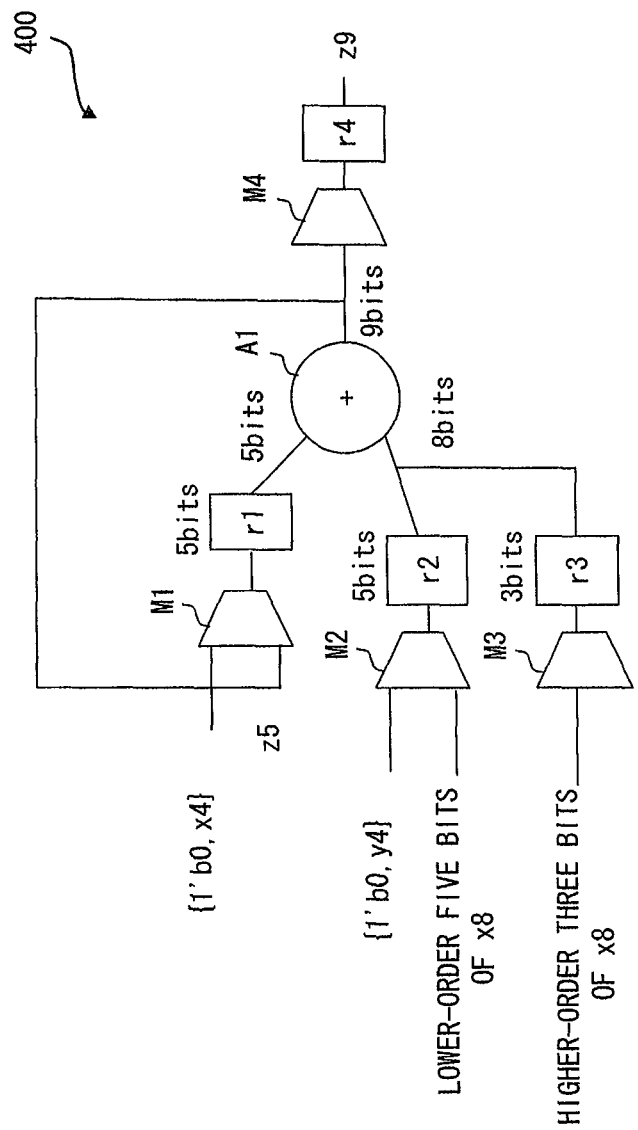
FIG. 13 is a circuit diagram showing a circuit configuration of data paths generated by a behavioral synthesis method according to a first embodiment of the present invention.

That is, as shown in FIG. 13, the data path 400 includes a multiplexer M1 that selects one of the variable x4 and the variable z5, which is the output of an adder A1, and outputs the selected variable to a register r1, the register r1 that holds the variable selected by the multiplexer M1, a multiplexer M2 that selects one of the variable y4 and the lower-order bits of the variable x8 and outputs the selected value to a register r2, the register r2 that holds the variable selected by the multiplexer M2, a multiplexer M3 that outputs the higher-order bits of the variable x8 to a register r3, the register r3 that holds the higher-order bits of the variable x8 through the multiplexer M3, the adder A1 that adds the value of the register r1 and the values of the registers r2 and r3, a multiplexer M4 that outputs the output of the adder A1 to a register r4, and the register r4 that holds the output of the adder A1 through the multiplexer M4 and outputs the held value as the variable z9.

A net list of the data path shown in FIG. 13 is generated. Further, a control circuit table with which this data path is controlled according to the control step is also generated (S206). For example, in order to determine registers and variables that are used in each control step based on the lifetime table 334 shown in FIG. 12, a control circuit table for controlling multiplexers according to this lifetime table 334 is generated. For example, in the control circuit table, control steps are associated with multiplexers that are controlled at their timings.

Figure 14:
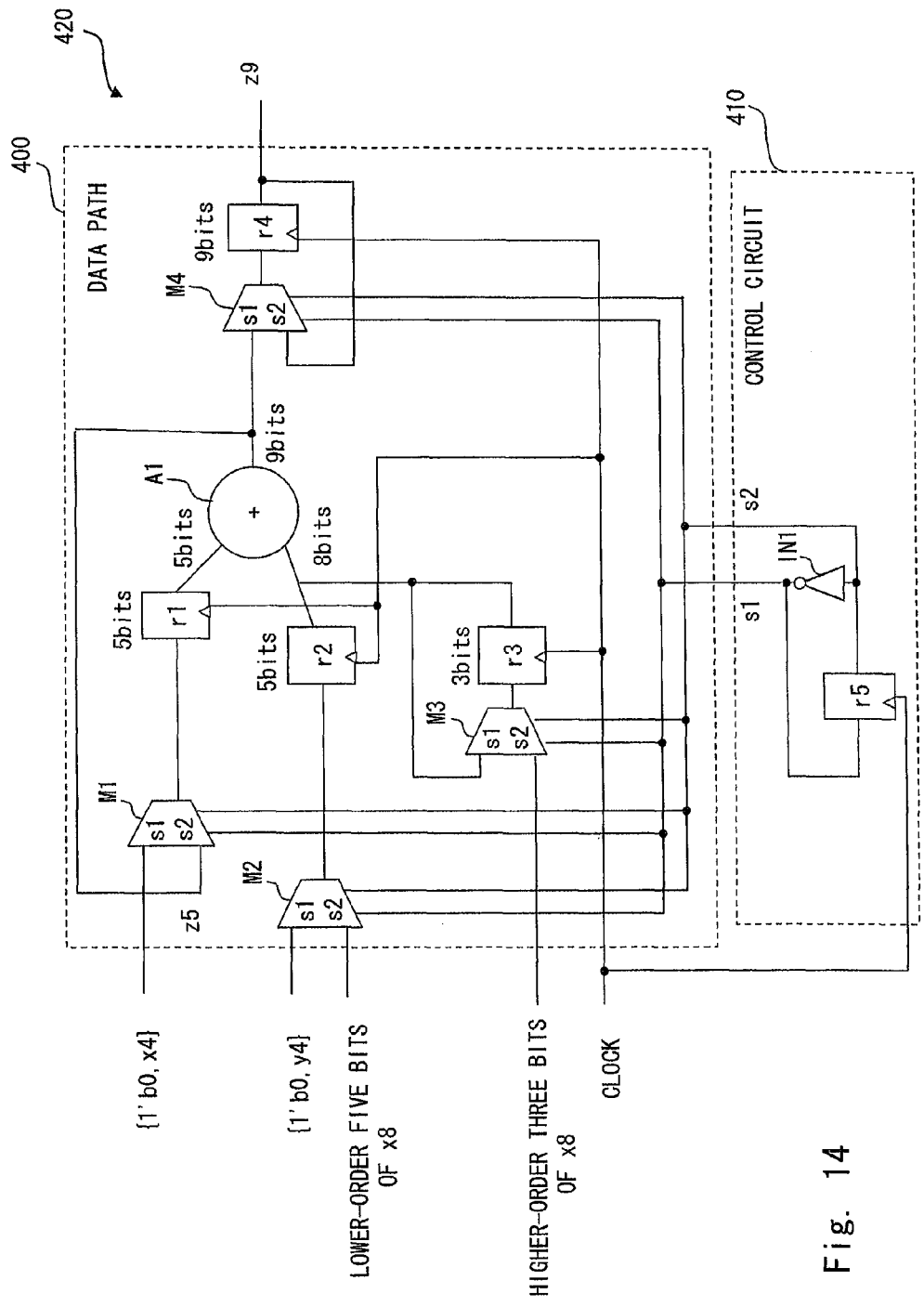
FIG. 14 is a circuit diagram showing a circuit configuration of a synthesized circuit generated by a behavioral synthesis method according to a first embodiment of the present invention.

Then, upon creation of the net list of the data path shown in FIG. 13 and the control circuit table, as shown in FIG. 14, an RTL of a synthesized circuit 420 that is obtained by combining the data path 400 with a control circuit 410 is output (S207).

A control circuit 410 that outputs control signals s1 and s2 corresponding to the control steps 1 and 2 is generated based on the control circuit table. Then, these control signals s1 and s2 are connected to the multiplexers of data path 400 so that they are supplied to those multiplexers. Further, a clock is supplied to the control circuit 410 and the data path 400.

That is, as shown in FIG. 14, this synthesized circuit 420 includes the data path 400 and the control circuit 410.

The configuration of the data path 400 is similar to that shown in FIG. 13. Further, in the data path 400, a clock is supplied to each of the registers r1, r2, r3 and r4. Further, the control signals s1 and s2 are supplied to each of the multiplexers M1, M2, M3 and M4.

The control circuit 410 includes a register r5 that generates a control signal s2 that repeatedly becomes "0" and "1" at each timing of the clock, and an inverter IN1 that generates a control signal s1 that is the inverted signal of the control signal s2.

The steps 1 and 2 are switched by the control signals s1 and s2. For example, the step 1 is selected by the control signal s1 and the step 2 is selected by the control signal s2.

When the control signal s1 is "1" and the control signal s2 is "0", the multiplexer M1 selects the variable x4 and the variable x4 is held by the register r1; the multiplexer M2 selects the variable y4 and the variable y4 is held by the register r2; and the adder A1 adds the variable x4 to the variable y4 and outputs the result as the variable z5.

Next, when the control signal s1 is "0" and the control signal s2 is "1", the multiplexer M1 selects the variable z5 and the variable z5 is held by the register r1; the multiplexer M2 selects the lower-order five bits of the variable x8 and they are held by the register r2; the multiplexer M3 selects the higher-order three bits of the variable x8 and they are held by the register r3; and the adder A1 adds the variable z5 and the variable x8. Further, the multiplexer M4 selects the output of the adder A1 and it is held by the register r4. Therefore, the output result of the adder A1 is output as the variable z9.

FIGS. 15 and 16 show an example of an RTL description in which the synthesized circuit 420 is described by using the Verilog-HDL. The RTL is described on a module basis with a hierarchical structure. For example, the text data of the RTL description is stored in the RTL information storage unit 210.

In this example, firstly, a top module description 501 for the top, which is the highest layer, is described. Next, a control circuit module description 502 for a control circuit, which is lower than the top module, is described. Next, a data path module description 503 for a data path(s), which is lower than the top module, is described. The control circuit module description 502 corresponds to the control circuit 410 shown in FIG. 14, and the data path module description 503 corresponds to the data path 400 shown in FIG. 14.

In the top module description 501, input/output signals of the data path (501a) and input/output signals of the control circuit (501b) are described.

In the control circuit module description 502, a relation between the register r5 and the control signal s2 (502a), a relation between the inverted signal of the register r5 and the control signal s1 (502b), and a relation between the clock and the register r5 (502c) are described.

In the data path module description 503, bit widths of the variables x4, y4, x8 and z9 (503a), bit widths of the registers r1, r2, r3 and r4 (503b), relations between the registers r1, r2 and r3 and the adder (503c), relations between the clock and the registers r1, r2, r3 and r4 (503d), and relations between the control signals s1 and s2 and the registers r1, r2, r3 and r4 (503e) are described.

In order to compare the behavioral synthesis method according to the first embodiment of the present invention with the behavioral synthesis method in related art, a reference example in which registers are allocated by a related-art behavioral synthesis method is explained hereinafter with reference to FIG. 32.

Figure 32:
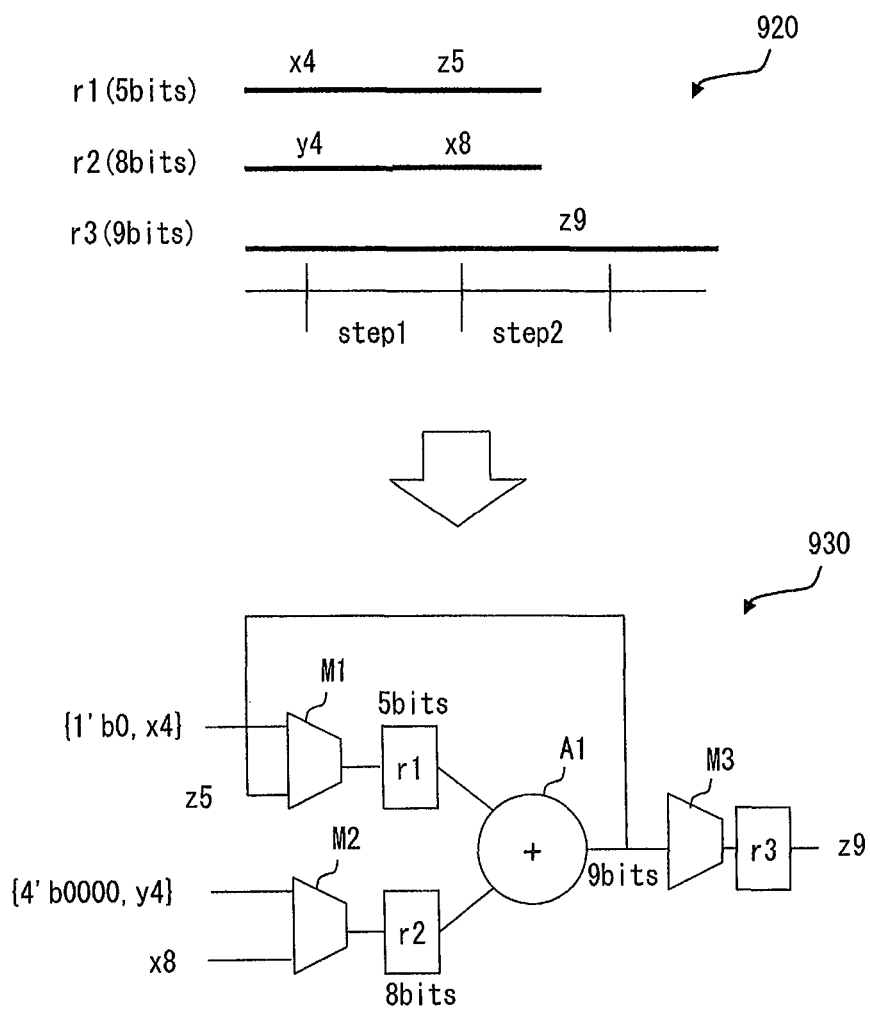
FIG. 32 is a diagram showing a reference example for a comparison with the present invention.

The reference numeral 920 in FIG. 32 is a lifetime table that is obtained by allocating registers for the lifetime table 330 shown in FIG. 8 by a related-art behavioral synthesis method.

In the related-art behavioral synthesis method, the only condition for sharing a register is that the lifetimes of variables do not overlap each other. In this example, the variable x4 and the variable z5 are two variables whose lifetimes do not overlap each other. Further, the variable y4 and the variable x8 are another two variables whose lifetimes do not overlap each other.

As a result, as the lifetime table 920 shown in FIG. 32, one register is allocated to the variables whose lifetimes do not overlap. That is, a register r1 whose bit width is five bits according to the bit width of the variable z5, which has the larger bit width, is allocated to the variable x4 and the variable z5. A register r2 whose bit width is eight bits according to the bit width of the variable x8, which has a larger bit width, is allocated to the variable y4 and the variable x8. Since the variable z9 cannot be shared, a register r3 whose bit width is nine bits according to the bit width of the variable z9 is allocated to the variable z9.

The reference numeral 930 in FIG. 32 is a data path generated based on the lifetime table 920 shown in FIG. 32.

The registers r1, r2 and r3, which are allocated based on the lifetime table 920, are connected with an adder A1. In order to switch the variables that are input to the shared registers r1 and r2 according to the control step in the lifetime table 920, multiplexers M1 and M2 are connected to the registers r1 and r2. Further, in order to control the timing at which the variables are input to the register r3 according to the control step, a multiplexer M3 is connected to the register r3.

That is, as the data path 930 shown in FIG. 32, the data path 930 includes a multiplexer M1 that selects one of the variable x4 and the variable z5, which is the output of an adder A1, and outputs the selected variable to a register r1, the register r1 that holds the variable selected by the multiplexer M1, a multiplexer M2 that selects one of the inputs, i.e., one of the variable y4 and the variable x8 and outputs the selected variable to a register r2, the register r2 that holds the variable selected by the multiplexer M2, the adder A1 that adds the value of the register r1 with the value of the register r2, a multiplexer M3 that outputs the output of the adder A1 to a register r3, and the register r3 that holds the output of the adder A1 through the multiplexer M3 and outputs the held value as the variable z9.

As shown in FIG. 32, the circuit generated by the related-art behavioral synthesis method has such a circuit configuration that after values having different bit widths are shared, all the bits of the registers, each of which is generated according to the variable having the larger bit width, are accessed. As a result, there has been a problem that even at a timing at which an operation can be performed by accessing only the lower-order bits, wasteful electric power is consumed for the unnecessary higher-order bits.

For example, in the circuit shown in FIG. 32, since the variable z5, which is the addition result of the 4-bit variable x4 and the 4-bit variable y4, is stored in the 5-bit register r1, the value of the register r1 does not change regardless of the value in the sixth and higher bits of the input of the adder. However, since the value of the variable y4 is extended to eight bits and accessed selectively with the 8-bit variable x8, the selection is also performed for the unnecessary sixth and higher bits, and thereby consuming wasteful electric power.

Further, in the circuit shown in FIG. 32, the description will be created in such a manner that when the value of the 4-bit variable y4 is taken into the register r2, "0" is explicitly assigned to each of the fifth and higher bits of the register r2. The assignment to the sixth and higher bits is also performed at the timing at which the value of the variable y4 is taken into the register r2. Therefore, even if a clock-gating circuit is formed for each bit of the register r2 in the subsequent process, for example, these higher bits cannot be handled by the clock-gating circuit, and thus reducing the opportunities for reducing the electric power.

As described above, in the related-art behavioral synthesis method, since the register is shared according to the bit width of the variable having a larger bit width, unused bits are undesirably generated for the variable having a smaller bit width. Therefore, there has been a problem that the number of bits of the shared register and the multiplexers that switch their inputs is wastefully large. This causes another problem that the circuit size becomes larger.

In recent years, as semiconductors have becomes finer and finer, it has become very difficult or impossible to ignore the static power consumption caused by the leak current. The leak current tends to increase with the increase in the circuit size. Therefore, if the size can be reduced, the static power consumption may be also reduced. In the related-art behavioral synthesis method, since the number of bits of registers and multiplexers is wistfully large, there has been also room for optimization in terms of this static power consumption.

Further, in the related-art behavioral synthesis method, 8-bit switching is performed even for a 4-bit operation, and thus consuming wasteful power consumption. That is, the related-art behavioral synthesis method generates multiplexers each of which switches all the input bits of a register, including unused wasteful bits, even when a variable having a smaller bit width is stored. Therefore, there has been also room for optimization in terms of the dynamic power consumption, which is consumed due to the switching.

Further, in the related-art behavioral synthesis method, since values are explicitly assigned to unused bits, there is no way of using the clock-gating, thus causing a problem that it is impossible to reduce the dynamic power consumption.

In contrast to this, in this embodiment of the present invention, as in the case of the above-described lifetime table 334 shown in FIG. 12, when a register is shared for variables having different bit widths, the variable having a larger bit width is divided and a register having a bit width that is determined according to the bit width of the variable having a smaller bit width is allocated and shared. Further, another register is allocated to the remaining bits.

In this way, as shown in FIG. 13, in the sharing between the variable y4 and the variable x8, a register is shared with the bit width (five bits) that is determined according to the variable y4, which has the smaller bit width. Therefore, the bit width of the multiplexer that selects the input of the register can be also reduced to five bits, which is smaller than the eight bits in the related art shown in FIG. 32. Therefore, since the number of bits to be switched is reduced, the size of the multiplexer is also reduced. Further, in proportion to the size, the leak current can be also reduced, thus making it possible to reduce the static power consumption. Further, the switching of the unused bits at the time of the switching of the multiplexer can be reduced, and therefore the dynamic power consumption can be also reduced.

Further, the remaining higher-order bits, which are obtained by dividing the variable x8, are assigned to the register r3 different from the shared register. Therefore, it is possible to use the clock-gating regardless of the timing at which the value of the variable y4 is taken, and thus making it possible to reduce the dynamic power consumption even further.

[Second Embodiment of the Invention]

Figure 17:
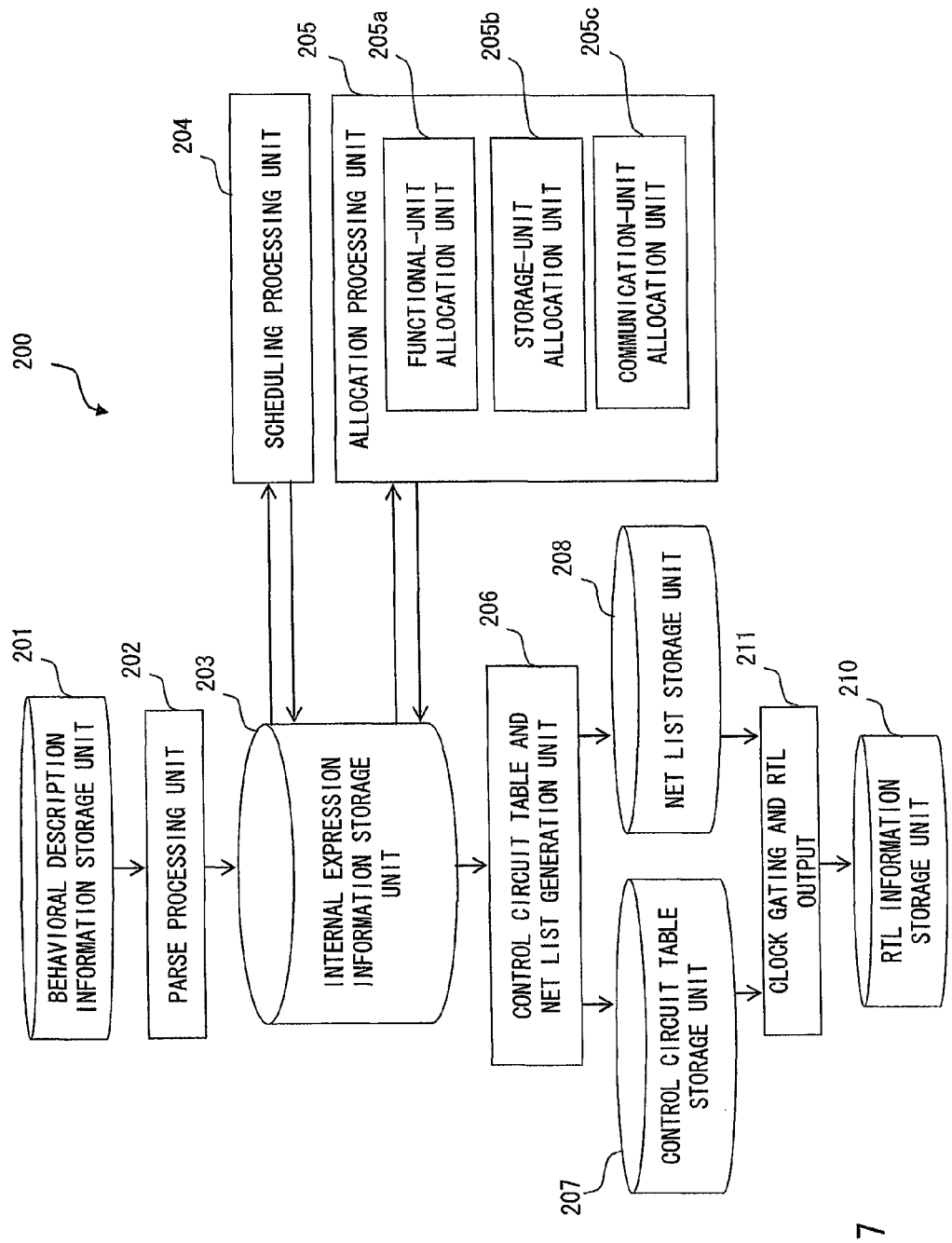
FIG. 17 is a behavioral description showing a functional configuration of a behavioral synthesis apparatus according to a second embodiment of the present invention.

A second embodiment according to the present invention is explained hereinafter with reference to the drawings. FIG. 17 shows a functional configuration of a behavioral synthesis apparatus according to the second embodiment of the present invention.

The configuration of the behavioral synthesis apparatus 200 shown in FIG. 17 is different from the configuration shown in FIG. 2 only in the RTL output unit. The other configuration is similar to that shown in FIG. 2. That is, the behavioral synthesis apparatus 200 according to this embodiment includes a clock gating and RTL output unit 211 in place of the RTL output unit 209 of the first embodiment.

The clock gating and RTL output unit 211 generates and outputs RTL information of a synthesized circuit including clock gating based on the control circuit table stored in the control circuit table storage unit 207 and the net list of the data path stored in the net list storage unit 208.

Figure 18:
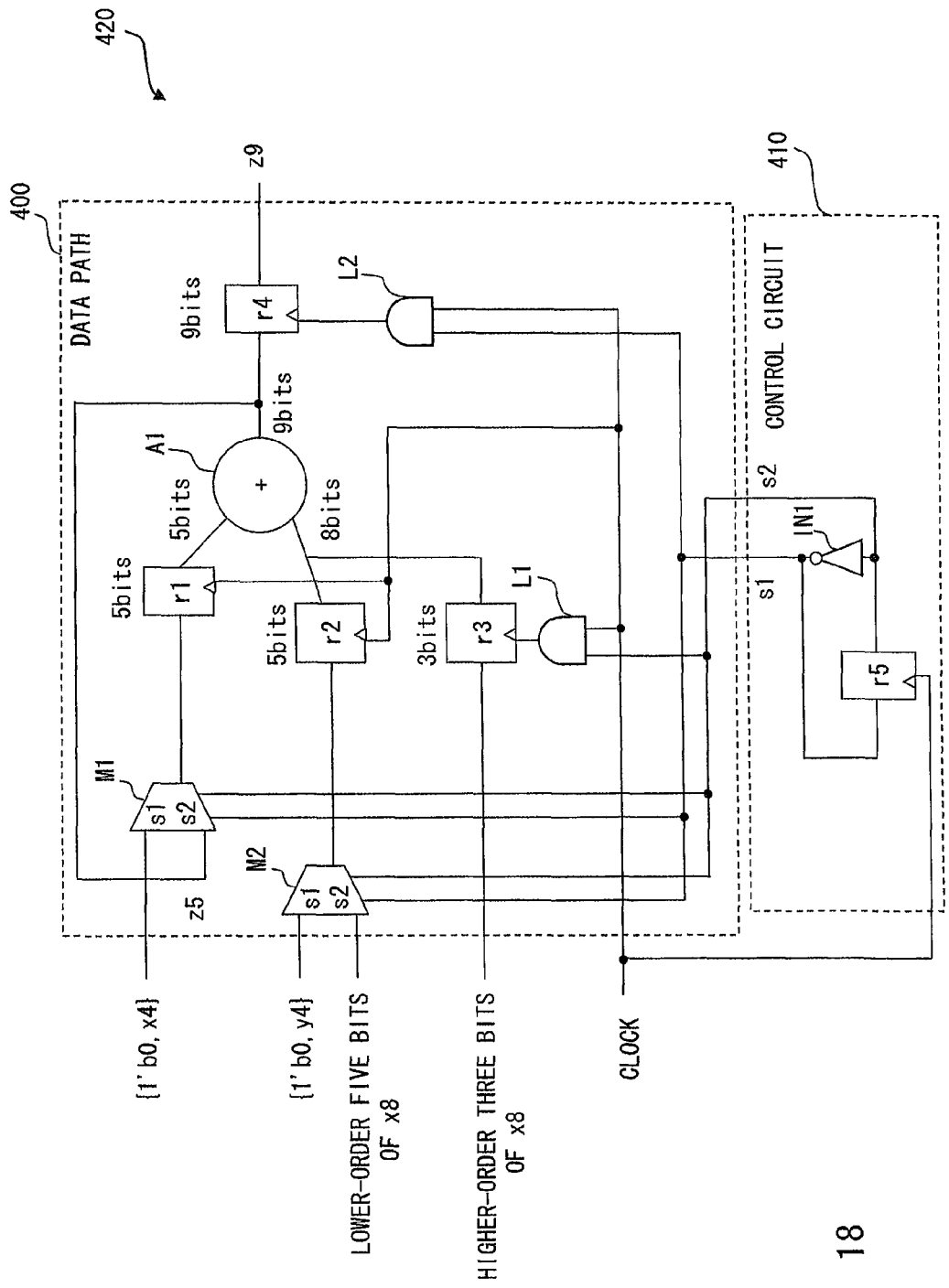
FIG. 18 is a circuit diagram showing a circuit configuration of a synthesized circuit generated by a behavioral synthesis method according to a second embodiment of the present invention.

FIG. 18 shows an example of a synthesized circuit 420 generated by the clock gating and RTL output unit 211. When compared to the configuration shown in FIG. 14, the configuration of the control circuit 410 in the synthesized circuit 420 shown in FIG. 18 is identical to that shown in FIG. 14. However, the data path 400 includes clock gating elements L1 and L2 in place of the multiplexers M3 and M4.

Each of these clock gating elements L1 and L2 is formed from an OR circuit. The clock gating elements L1 and L2 regulates the change of the clock supplied to the registers r3 and r4. The clock gating element L1 performs a logical sum operation between the clock and the control signal s2 and supplies the resulting signal to the clock terminal of the register r3. The clock gating element L2 performs a logical sum operation between the clock and the control signal s1 and supplies the resulting signal to the clock terminal of the register r4.

Figure 19:
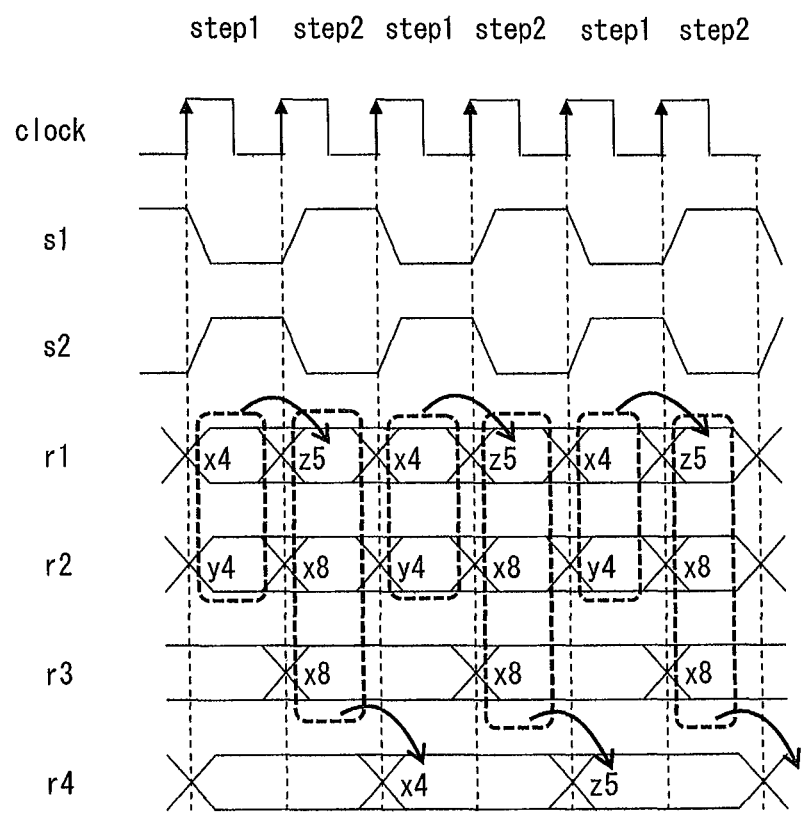
FIG. 19 is a timing chart showing a behavior of a synthesized circuit generated by a behavioral synthesis method according to a second embodiment of the present invention.

FIG. 19 is a timing chart showing the behavior of the synthesized circuit 420 shown in FIG. 18. Each of the control signals s1 and s2 repeatedly becomes "0" and "1" at each timing of the clock, and the steps 1 and 2 are repeated according to these clocks.

In the step 1, the variable x4 is held in the register r1 and the variable y4 is held in the register r2. Further, the adder A1 adds the variable x4 to the variable y4 and outputs the variable z5. In the step 2, the variable z5 is held in the register r1, and the lower-order bits and the higher-order bits of the variable x8 are held in the register r2 and the register r3 respectively. Further, the adder A1 adds the variable z5 and the higher-order bits and the lower-order bits of the variable x8, and outputs the variable z9.

Note that the variable x8 is used only in the step 2 in the register r3. Therefore, the clock is gated in the timing of the step 1 so that the register r3 does not perform the latching action, and the clock is supplied only in the step 2 so that the register r2 performs the latching action. Note that when the clock gating is not performed as in the case of the configuration shown in FIG. 14, the register r3 alternately stores the variable x8 and "0" at each clock.

Further, the value of the variable z9 is fixed only in the step subsequent to the step 2 in the register r4. Therefore, the clock is gated in the timing of the step 2 so that the register r4 does not perform the latching action, and the clock is supplied only in the step subsequent to the step 2 (i.e., in the step 1 in this example) so that the register r4 performs the latching action. As shown in FIG. 19, since the number of clocks supplied to the registers r3 and r4 is reduced by half, the dynamic power consumption of the registers r3 and r4 can be reduced by half.

As described above, in this embodiment, by performing clock gating for registers that hold variables, the consumption power can be reduced. In particular, there are cases in the related art in which clock gating cannot be implemented because of the register sharing. However, as explained above in the first embodiment of the present invention, since the variable having a larger bit width is divided into higher-order bits and lower-order bits and they are assigned to different registers, it is possible to implement clock gating for the register for the higher-order bits, and thus making it possible to reduce the power consumption without exception.

[Third Embodiment of the Invention]

A third embodiment according to the present invention is explained hereinafter with reference to the drawings. In the first embodiment, in the storage-unit allocation process, a register(s) is allocated while paying attention to two variables whose lifetimes do not overlap. In contrast to this, in this embodiment, a register(s) is allocated while paying attention to two or more variables whose lifetimes do not overlap. The configuration other than the storage-unit allocation is similar to those of the first and second embodiments.

Figure 20:
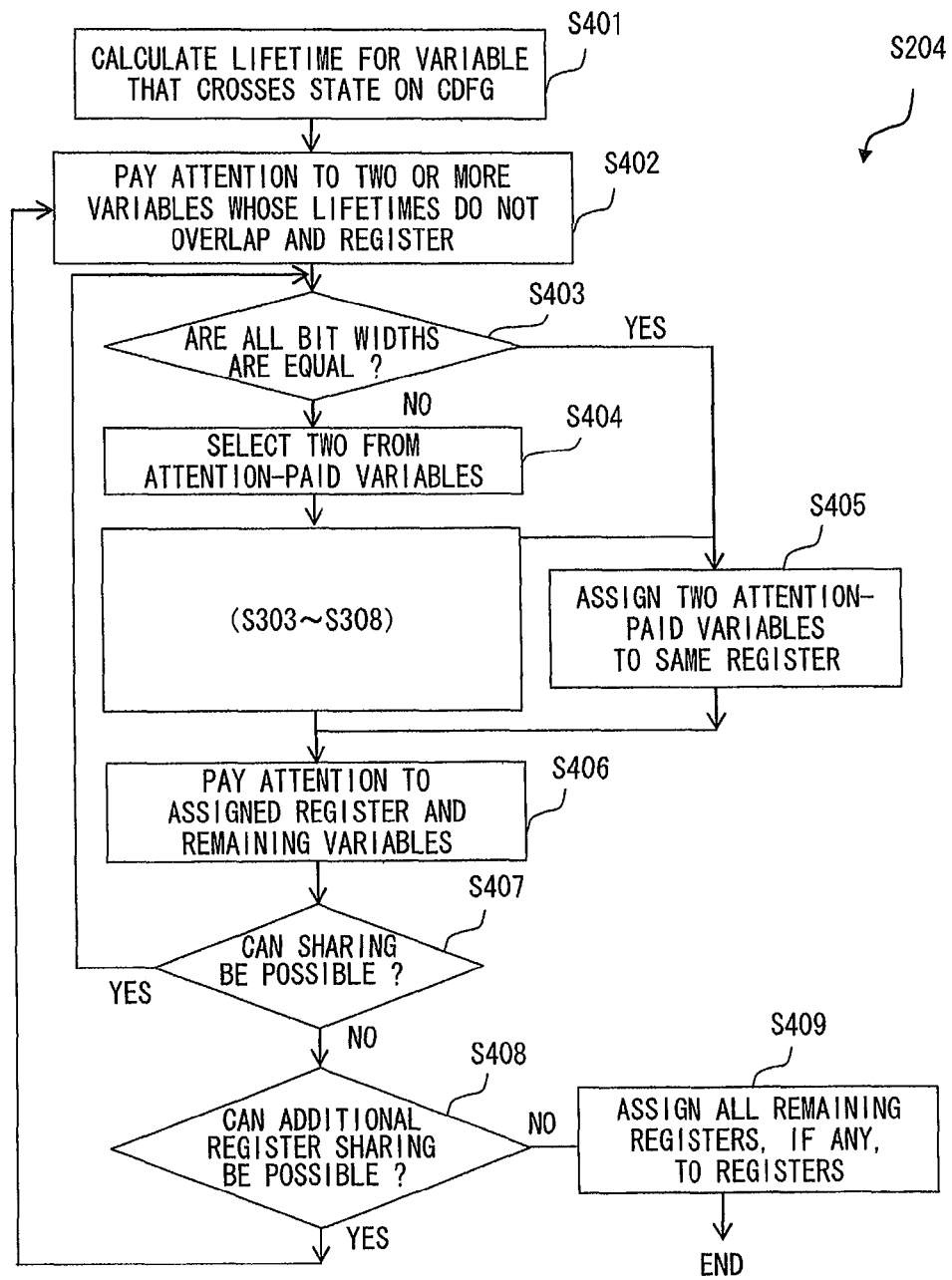
FIG. 20 is a flowchart showing a flow of a storage-unit allocation method according to a third embodiment of the present invention.

FIG. 20 shows a flow of a storage-unit allocation process (S204) according to a third embodiment of the present invention.

As shown in FIG. 20, firstly, the lifetime calculation unit 221 calculates a lifetime for each variable that cuts across a state on a CDFG (S401), and the variable select unit 222 pays attention to two or more variables that do not overlap each other and a register(s) (S402). Next, the bit width detection unit 223 determines whether or not the bit widths of all the attention-paid variables are equal to each other (S403).

When it is determined that the bit widths are different in the step S403, the sign extension unit 224 selects two variables from the two or more attention-paid variables (S404). After the two variables are selected, the processes in the steps S303 to S308 in FIG. 5 are performed in a similar manner to those of the first embodiment.

That is, it is determined whether the bit widths of the two selected variables are different or not (S303). When the bit widths are different, the variable having the smaller bit width is sign-extended by the minimum necessary amount (S304). It is determined whether the bit widths of the two sign-extended variables are different or not (S305). When the bit widths are different, the variable having the larger bit width is divided into higher-order bits and lower-order bits according to the bit width of the variable having the smaller bit width (S306). The variable having the smaller bit width and the lower-order bits of the divided variable having the larger bit width are assigned to the same register (S307). Then, the higher-order bits of the divided variable having the larger bit width are assigned to another register (S308).

When the bit widths of all the attention-paid variables are equal to each other in the step S403 or when the bit widths of the two selected variables are equal to each other in the step S303 or S305, the same register is allocated to all the attention-paid variables or to the two selected variables (S405).

After the register(s) is allocated in the step S308 or S405, the register allocation unit 226 pays attention to the allocated register(s) and the remaining variables.

Next, the register allocation unit 226 determines whether or not additional register sharing can be implemented (S407). For a plurality of variables, which are currently paid attention, it is determined whether or not additional register sharing can be implemented while also taking the allocated register(s) into account. When it is determined that additional register sharing can be implemented in the step S407, the processes at the step S403 and the subsequent steps are repeated and register sharing is implemented by selecting additional two variables.

When it is determined that the sharing cannot be implemented any more in the step S407, the register allocation unit 226 determines whether or not additional register sharing can be implemented (S408). When it is determined that additional register sharing can be implemented in the step S408, the processes at the step S402 and the subsequent steps are repeated. Further, when it is determined that additional register sharing cannot be implemented anymore in the step S408, the register allocation unit 226 assigns all the remaining variables, if any, to registers and the allocation process has been thereby finished (S409).

As described above, in this embodiment, when the storage-unit allocation is performed, attention is paid to two or more variables that do not overlap each other. Then, when the bit widths of these variables are different, two variables are selected and a register(s) is allocated. In this way, even when there are two or more variables whose lifetimes do not overlap, a register(s) can be shared as in the case of the first embodiment.

[Fourth Embodiment of the Invention]

A fourth embodiment according to the present invention is explained hereinafter with reference to the drawings. In the third embodiment, in the storage-unit allocation process, a register(s) is allocated by paying attention to two or more variables whose lifetimes do not overlap and then by selecting two variables. In contrast to this, in this embodiment, attention is paid to two or more variables whose lifetimes do not overlap and a register(s) is allocated to these two or more attention-paid variables. The configuration other than the storage-unit allocation is similar to those of the first and second embodiments.

Figure 21:
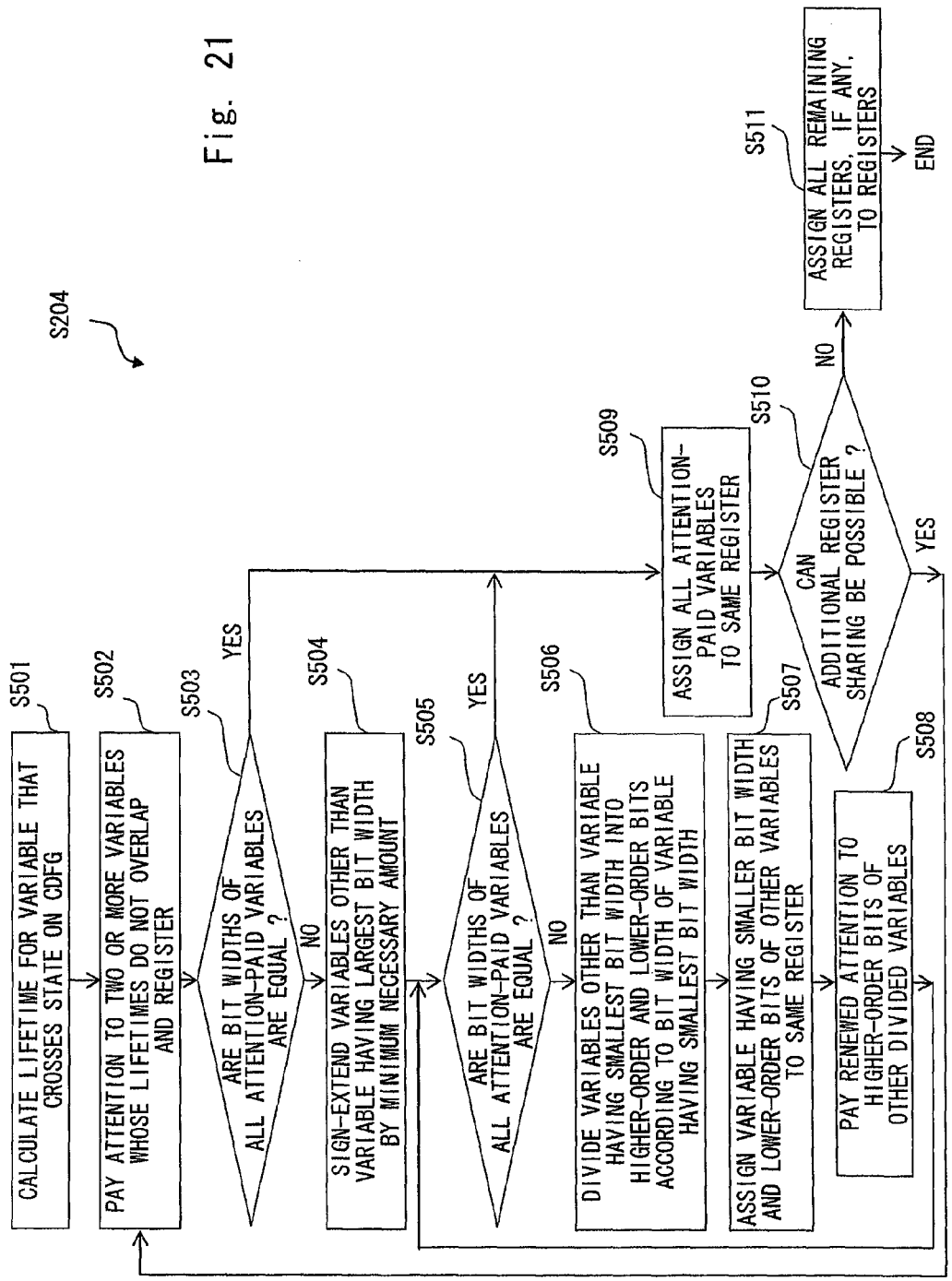
FIG. 21 is a flowchart showing a flow of a storage-unit allocation method according to a fourth embodiment of the present invention.

FIG. 21 shows a flow of a storage-unit allocation process (S204) according to a fourth embodiment of the present invention.

As shown in the figure, firstly, the lifetime calculation unit 221 calculates a lifetime for each variable that cuts across a state on a CDFG (S501), and the variable select unit 222 pays attention to two or more variables that do not overlap each other and a register(s) (S502). Next, the bit width detection unit 223 determines whether or not the bit widths of all the attention-paid variables are equal to each other (S503).

When it is determined that the bit widths of all the variables are not equal to each other in the step S503, the sign extension unit 224 sign-extends the variables other than the variable having the largest bit width by the minimum necessary amount (S504). Next, the bit width detection unit 223 determines whether or not the bit widths of all the attention-paid variables are equal to each other after the sign-extension (S505).

When it is determined that the bit widths of all the variables are not equal to each other in the step S505, the variable division unit 225 divides each of the variables other than the variable having the smallest bit width into higher-order bits and lower-order bits according to the bit width of the variable having the smallest bit width (S506). Next, the register allocation unit 226 assigns the variable having the smallest bit width and the lower-order bits of the other variables to the same register (S507).

Next, the register allocation unit 226 pays renewed attention to the higher-order bits of the other divided variables (S508). After that, the step S505 and the subsequent steps are repeated, and registers are thereby allocated for the remaining divided variables.

When the bit widths of all the attention-paid variables are equal to each other in the step S503 or S505, the register allocation unit 226 assigns all the attention-paid variables to the same register (S509).

Next, the register allocation unit 226 determines whether or not additional register sharing can be implemented (S510). When it is determined that additional register sharing can be implemented in the step S510, the processes at the step S502 and the subsequent steps are repeated. Further, when it is determined that additional register sharing cannot be implemented any more in the step S510, the register allocation unit 226 assigns all the remaining variables, if any, to registers and the allocation process has been thereby finished (S511).

Next, a specific example of the behavioral synthesis method according to the fourth embodiment of the present invention is explained with reference to FIGS. 22 to 27.

Figure 22:
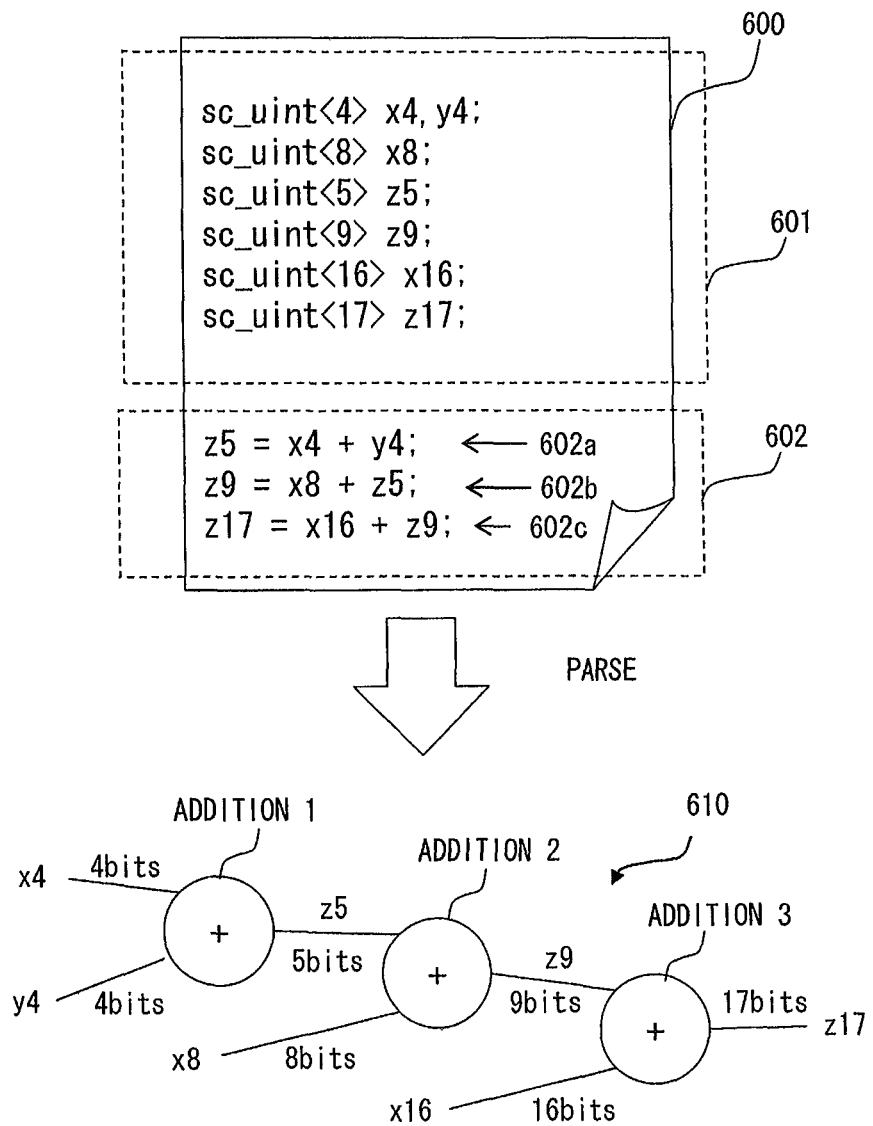
FIG. 22 is a diagram showing a specific example for explaining a behavioral synthesis method according to a fourth embodiment of the present invention.

Firstly, when the process of the behavioral synthesis method S200 starts, a behavioral description 600 shown in FIG. 22 is parsed and a CDFG 610 shown in FIG. 22 is thereby generated (S201).

In this behavioral description 600, variables x4, y4, x8, z5, z9, x16 and z17 are defined in a variable declaration description section 601 and formulas 602a, 602b and 602c using these variables are written in an operation description section 602.

When the behavioral description 600 is parsed, a CDFG 610 is generated as shown in FIG. 22. The CDFG 610 expresses that: the operation of an addition 1 corresponds to the formula 602a; a 4-bit variable x4 and a 4-bit variable y4 are added and the result is output to a 5-bit variable z5; the operation of an addition 2 corresponds to the formula 602b; the 5-bit variable z5 and an 8-bit variable x8 are added and the result is output to a 9-bit variable z9; the operation of an addition 3 corresponds to the formula 602c; and the 9-bit variable z9 and a 16-bit variable x16 are added and the result is output to a 17-bit variable z17.

Figure 23:
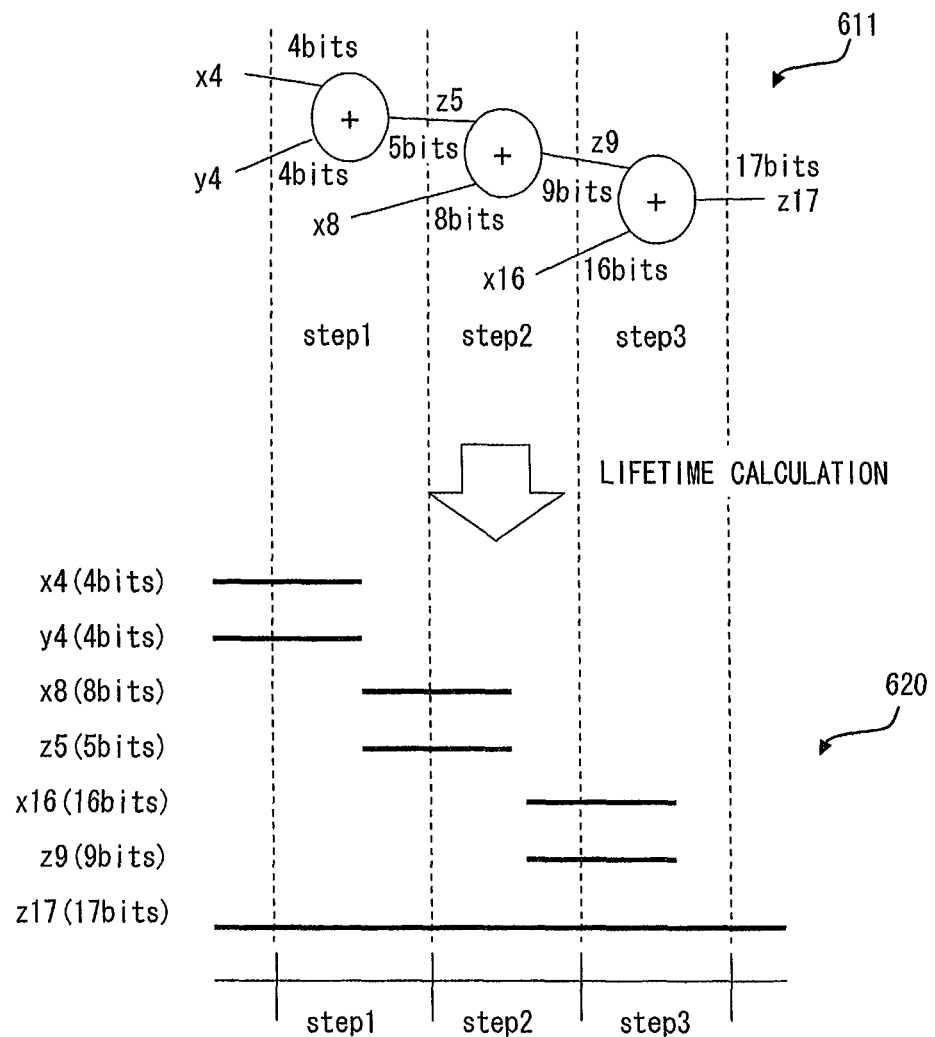
FIG. 23 is a diagram showing a specific example for explaining a behavioral synthesis method according to a fourth embodiment of the present invention.

Next, as the reference numeral 611 shown in FIG. 23, scheduling is performed for the CDFG 610 shown in FIG. 22 by separating the CDFG into control steps. As a result, a scheduled CDFG 611 in FIG. 23 is generated (S202).

In this example, the scheduling is made in such a manner that: in the step 1, the process of the addition 1 in which the variable x4 and the variable y4 are added and the result is output to the variable z5 is performed; in the next step 2, the process of the addition 2 in which the variable z5 and the variable x8 are added and the result is output to the variable z9 is performed; and in the next step 3, the process of the addition 3 in which the variable z9 and the variable x16 are added and the result is output to the variable z17 is performed.

Next, a lifetime for each variable is calculated based on the post-scheduling CDFG 611 shown in FIG. 23 and a lifetime table 620 shown in FIG. 23 is thereby generated (S501).

In this example, the lifetimes of the variables x4 and y4 are from the step preceding the step 1 to the step 1. The lifetimes of the variables x8 and z5 are from the step 1 to the step 2. The lifetimes of the variables x16 and z9 are from the step 2 to the step 3. Further, the lifetime of the variable z17 is the whole period.

Figure 24:
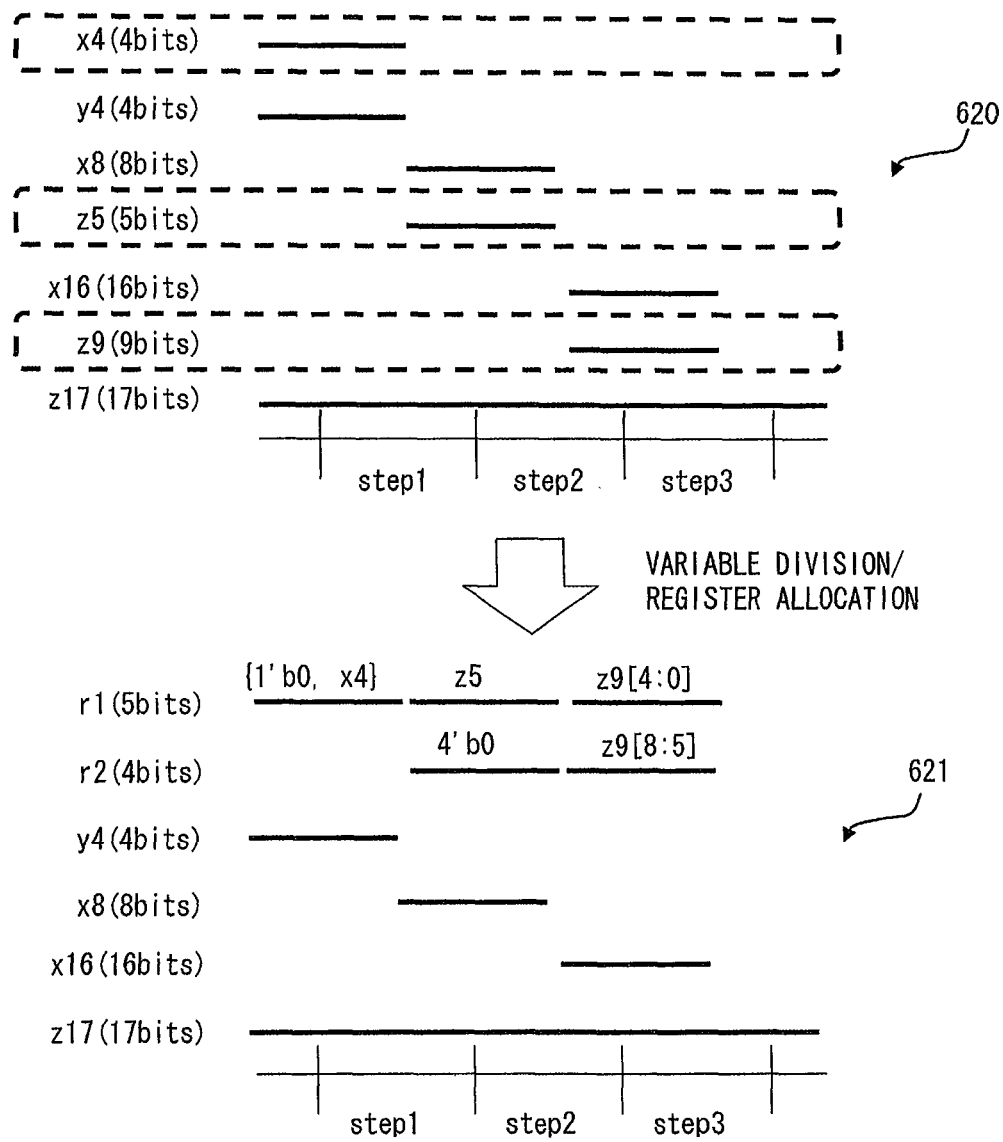
FIG. 24 is a diagram showing a specific example for explaining a behavioral synthesis method according to a fourth embodiment of the present invention.

Next, as the reference numeral 620 shown in FIG. 24, since the lifetimes of the variables x4, z5 and z9 do not overlap each other, attention is paid to these variables x4, z5 and z9 (S502). The bit widths of the variables x4, z5 and z9 are four bits, five bits and nine bits respectively. Therefore, their bit widths are different. Accordingly, the variables x4 and z5, which are not the variable having the largest bit width, are sign-extended by the minimum necessary amount, i.e., sign-extended to five bits and nine bits respectively (S504). The variable z5 is divided into higher-order four bits and lower-order five bits according to the bit width of the variable x4 (i.e., five bits), which has the smallest bit width. Further, the variable z9 is also divided into higher-order four bits and lower-order five bits (S506).

Then, as the reference numeral 621 shown in FIG. 24, the same register r1 is allocated to the variable x4 having the smallest bit width, the lower-order bits of the variable z5, and the lower-order bits of the variable z9 (S507). Further, attention is paid to the higher-order four bits of the divided variable z5 and the higher-order four bits of the variable z9 (S511). Since they have the same bit widths, the same register r2 is allocated to the higher-order four bits of the variable z5 and the higher-order four bits of the variable z9 (S509).

Figure 25:
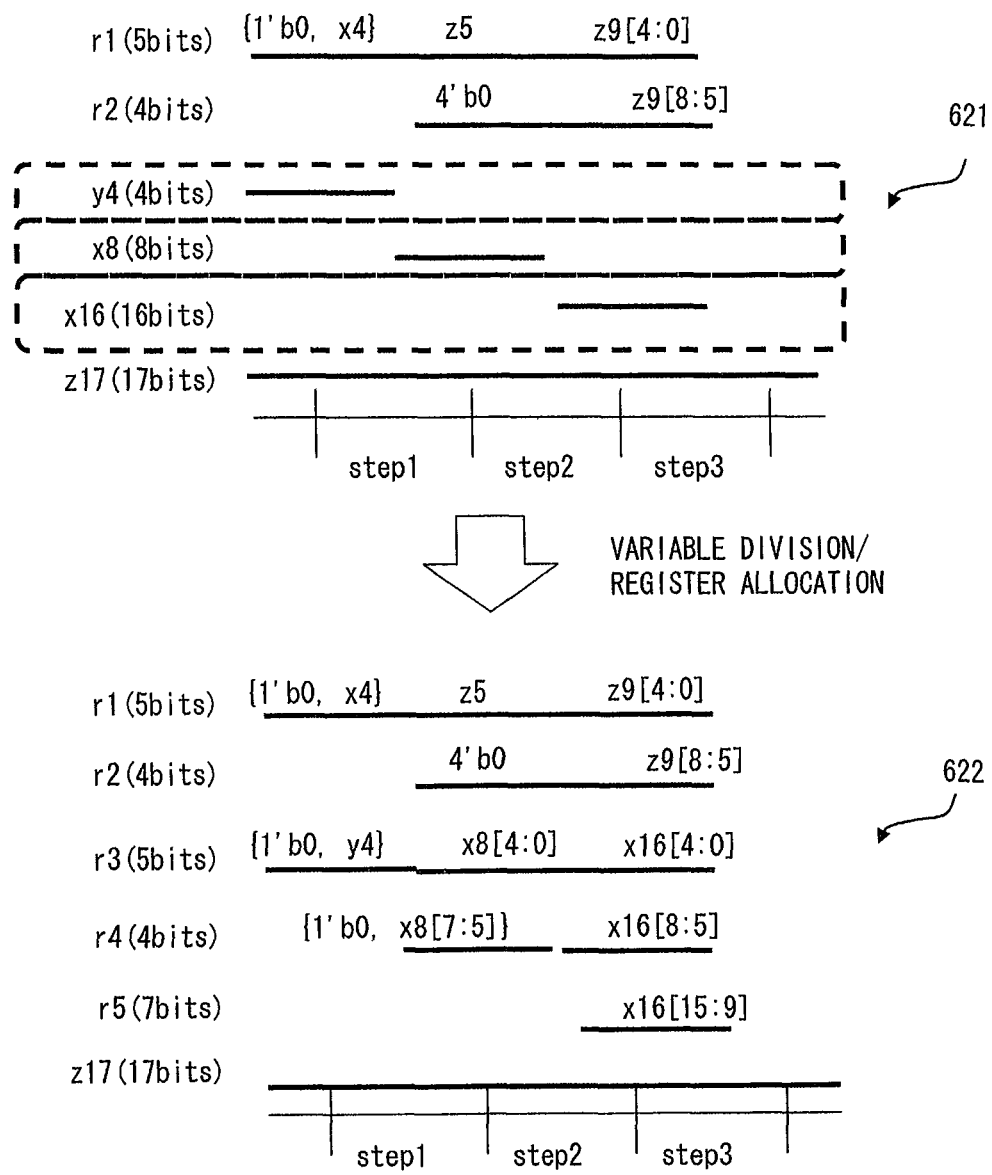
FIG. 25 is a diagram showing a specific example for explaining a behavioral synthesis method according to a fourth embodiment of the present invention.

After the registers are allocated to the variable x4, the variable z5, and the variable z9 as the reference numeral 621 shown in FIG. 25, attention is paid to the variable y4, the variable x8, and the variable x16 because their lifetimes do not overlap each other and thus additional register sharing can be implemented (S502).

The bit widths of the variables y4, x8 and x16 are four bits, eight bits and 16 bits respectively. Therefore, their bit widths are different. Accordingly, the variables y4 and x8, which are not the variable having the largest bit width, are sign-extended by the minimum necessary amount, i.e., sign-extended to five bits and nine bits respectively (S504).

Then, the variable x8 is divided into higher-order four bits and lower-order five bits according to the bit width of the variable y4 (i.e., five bits), which has the smallest bit width. Further, the variable x16 is also divided into higher-order 11 bits and lower-order five bits (S506). As the reference numeral 622 shown in FIG. 25, the same register r3 is allocated to the variable y4 having the smallest bit width, the lower-order bits of the variable x8, and the lower-order bits of the variable x16 (S507).

Further, attention is paid to the higher-order four bits of the divided variable x8 and the higher-order 11 bits of the variable x16 (S511). The higher-order 11 bits of the variable x16 is divided into higher-order seven bits and lower-order four bits according to the bit width of the higher-order bits of the variable x8 (i.e., four bits), which has the smaller bit width (S506). As the reference numeral 622 shown in FIG. 25, the same register r4 is allocated to the higher-order four bits of the variable x8, which has the smaller bit width, and the lower-order bits of the variable x16 (S507). Further, a register r5 is allocated to the remaining higher-order seven bits of the variable x16.

Next, although the variable z17 is left unassigned, additional register sharing cannot be implemented any more. Therefore, as the reference numeral 622 shown in FIG. 26 attention is paid to the variable z17 and a register r6 is allocated to the variable z17 as the reference numeral 623 shown in FIG. 26 (S511). With this process, the allocation process has been finished.

Figure 26:
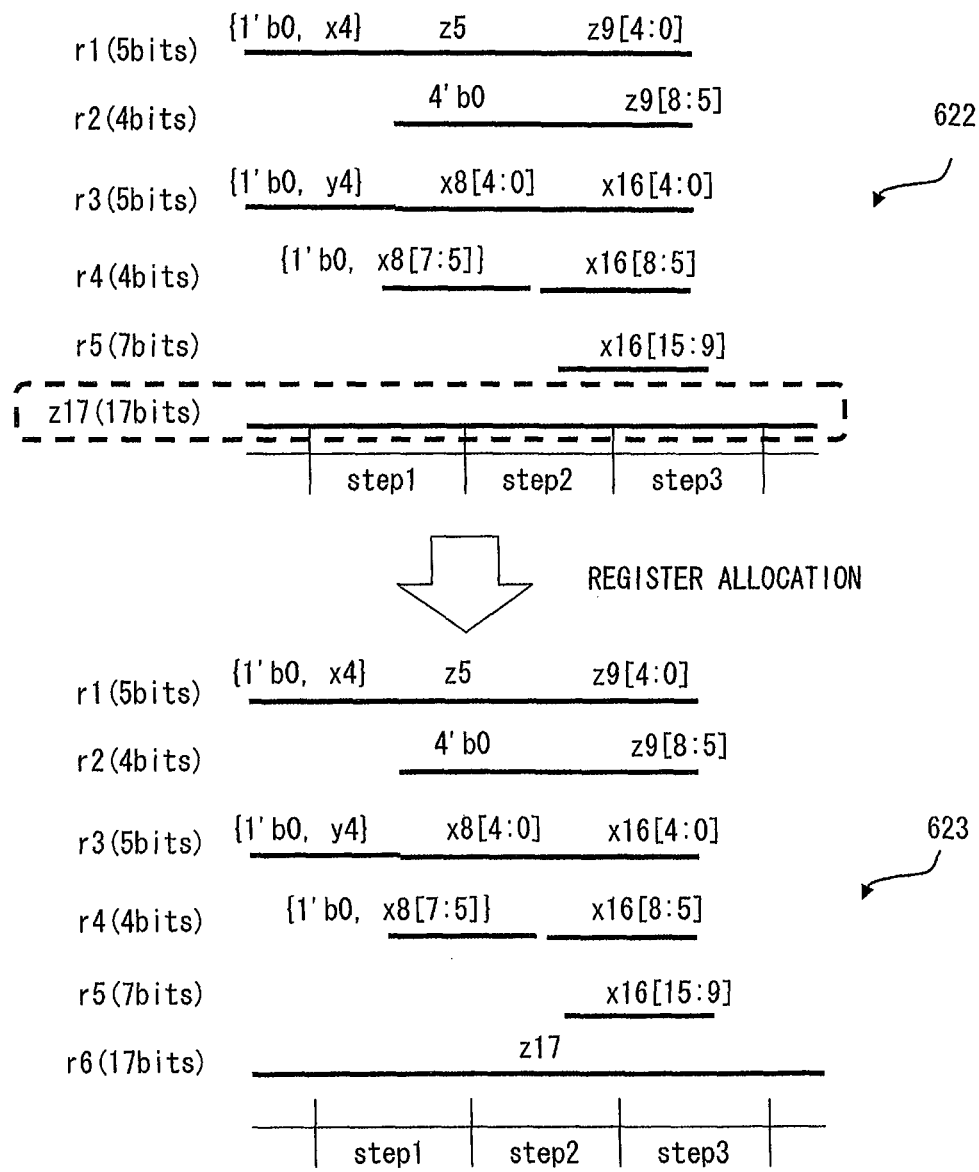
FIG. 26 is a diagram showing a specific example for explaining a behavioral synthesis method according to a fourth embodiment of the present invention.
Figure 27:
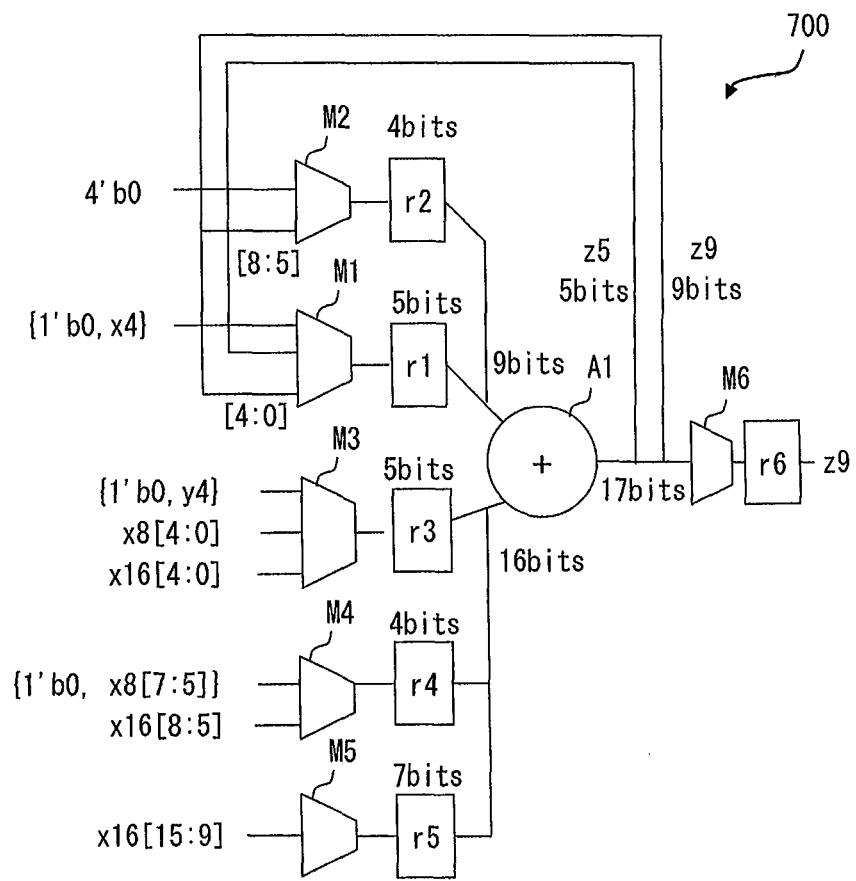
FIG. 27 is a circuit diagram showing a circuit configuration of data paths generated by a behavioral synthesis method according to a fourth embodiment of the present invention.
Figure 28:
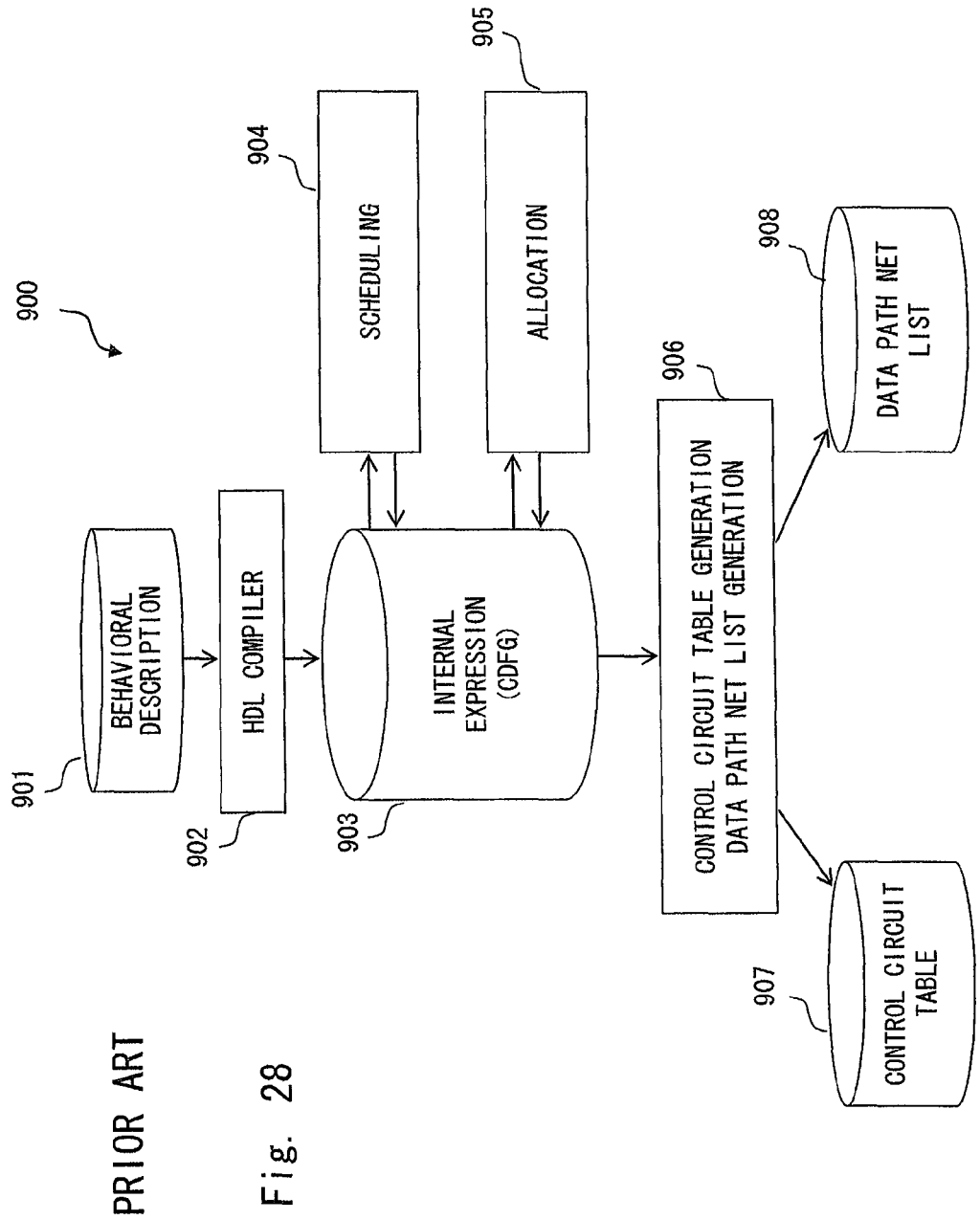
FIG. 28 is a diagram showing a related-art behavioral synthesis method.
Figure 29A:
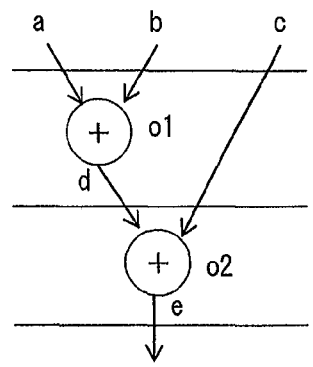
FIG. 29A is a diagram showing a related-art behavioral synthesis method.
Figure 29B:
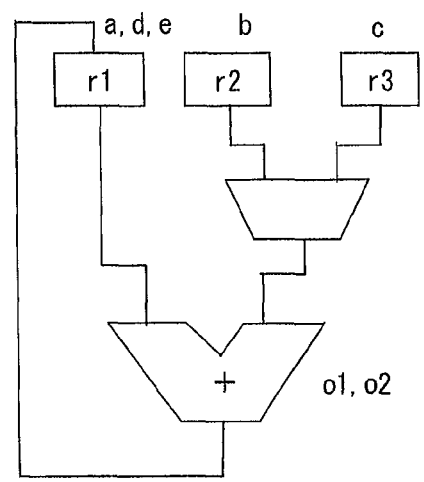
FIG. 29B is a diagram showing a related-art behavioral synthesis method.
Figure 29C:
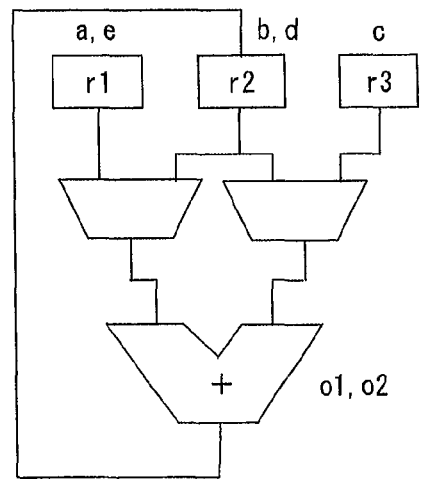
FIG. 29C is a diagram showing a related-art behavioral synthesis method.
Figure 30A:
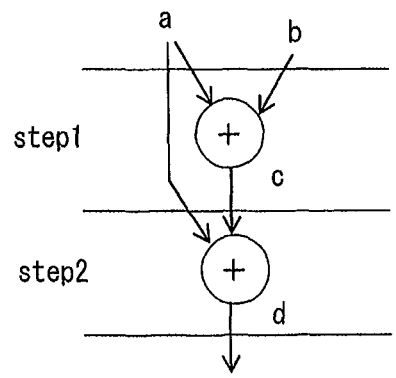
FIG. 30A is a diagram showing a related-art behavioral synthesis method.
Figure 30B:
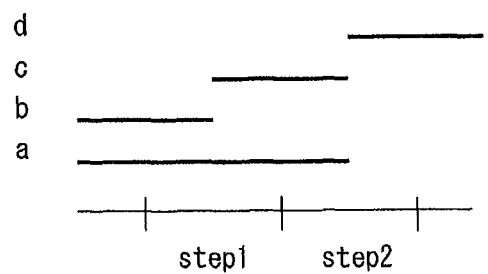
FIG. 30B is a diagram showing a related-art behavioral synthesis method.
Figure 30C:
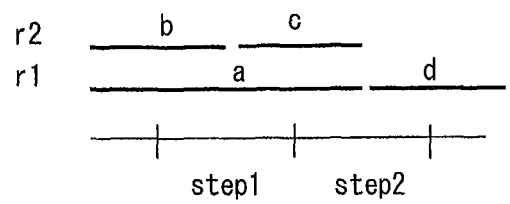
FIG. 30C is a diagram showing a related-art behavioral synthesis method.
Figure 31A:
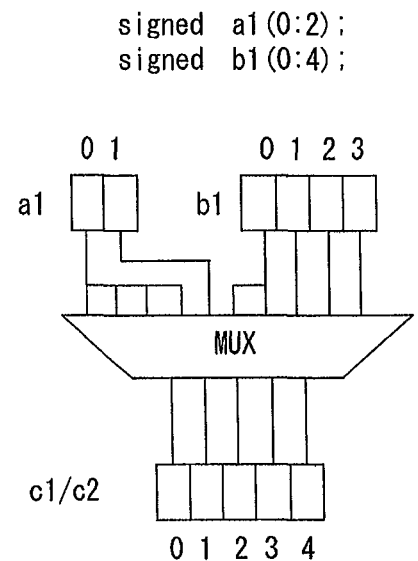
FIG. 31A is a diagram showing a related-art behavioral synthesis method.
Figure 31B:
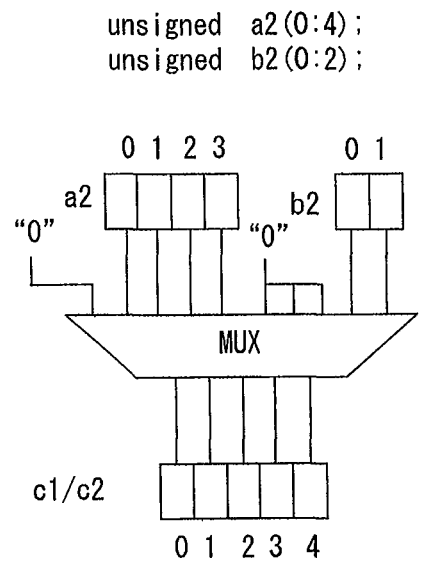
FIG. 31B is a diagram showing a related-art behavioral synthesis method.

FIG. 27 shows a configuration of a data path 700 generated based on the lifetime table 623 shown in FIG. 26. In the data path 700, the registers r1 to r5, which are allocated based on the lifetime table 623, are connected with an adder A1. In order to switch the variables that are input to the shared registers r1 to r4 according to the control step in the lifetime table 623, multiplexers M1 to M4 are connected to the registers r1 to r4. Further, in order to control the timings at which the variables are input to the registers r5 and r6 according to the control step, multiplexers M5 and M6 are connected to the registers r5 and r6.

That is, this data path 700 includes a multiplexer M1 that selects one of the variable x4, the variable z5 (which is the output of an adder A1), and the lower-order bits of the variable z9 (which is also the output of the adder A1), and outputs the selected value, a register r1 that holds the variable selected by the multiplexer M1, a multiplexer M2 that selects one of the higher-order bits of the variable z5 (4-bit "0") and the higher-order bits of the variable z9, and outputs the selected value, a register r2 that holds the variable selected by the multiplexer M2, a multiplexer M3 that selects one of the variable y4, the lower-order bits of the variable x8, and the lower-order bits of the variable x16, and outputs the selected value, a register r3 that holds the variable selected by the multiplexer M3, a multiplexer M4 that selects one of the higher-order bits of the variable x8 and the intermediate bits of the variable x16, and outputs the selected value, a register r4 that holds the variable selected by the multiplexer M4, a multiplexer M5 that outputs the higher-order bits of the variable x16 to a register r5, the register r5 that holds the higher-order bits of the variable x16 through the multiplexer M5, the adder A1 that adds the values of the registers r1 and r2 and the values of the registers r3, r4 and r5, a multiplexer M6 that outputs the output of the adder A1 to a register r6, and the register r6 that holds the output of the adder A1 through the multiplexer M6 as the variable z9.

As described above, in this embodiment, when the storage-unit allocation is performed, attention is paid to two or more variables that do not overlap each other. Then, a plurality of variables are divided according to the bit width of the variable having the smallest bit width and registers are allocated.

In this way, even when there are two or more variables whose lifetimes do not overlap, it is possible to reduce the bit width of a shared register(s) as in the case of the first embodiment.

Further, similarly to the first embodiment, the size of the multiplexer is reduced, thus making it possible to reduce the static electric power. Further, the (dynamic) power consumption at the time of the switching can be also reduced. Further, the opportunities for clock gating are increased. Therefore, it is possible to reduce the power consumption even further.

Note that the present invention is not limited to the above-described embodiments, and they can be modified as desired without departing from the spirit and scope of the present invention.

The first, second, third and fourth embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A behavioral synthesis method comprising using a computer to perform the steps of:
    creating data flow graph information that is obtained by scheduling a timing of operation behavior of variables based on behavioral description information including the operation behavior of the variables, each of the variables being input data to operation or output data from operation;
    generating lifetime information for each of the variables based on the scheduled data flow graph information, the lifetime information being a period during which data needs to be held in the variable;
    selecting, among the variables, variables having lifetimes not overlapping on a time axis, based on the generated lifetime information;
    allocating a first register having a first bit width to a first variable included in the selected variables and bits of the first bit width within another variable included in the selected variables, the first variable being defined to have the first bit width;
    allocating a second register to bits other than the bits of the first bit width within the another variable; and
    outputting circuit information of a synthesized circuit including the first and second registers.

2. The behavioral synthesis method according to claim 1, wherein
    in the allocation of the first register, the another variable is divided into bits of the first bit width and bits other than the bits of the first bit width, and the first register is allocated to the bits of the first bit width, and
    in the allocation of the second register, the second register is allocated to the bits other than the bits of the first bit width.

3. The behavioral synthesis method according to claim 1, wherein the first bit width is defined as a bit width including a bit indicating sign information of the first variable.

4. The behavioral synthesis method according to claim 1, wherein the first bit width is defined as a bit width that is obtained by performing sign-extension for the first variable described in the behavioral description information.

5. The behavioral synthesis method according to claim 4, wherein the first bit width is defined according to a bit width of an operation result of the first variable.

6. The behavioral synthesis method according to claim 1, wherein the bits of the first bit width within the another variable are lower-order bits of the another variable.

7. The behavioral synthesis method according to claim 1, wherein the bits other than the bits of the first bit width within the another variable are higher-order bits of the another variable.

8. The behavioral synthesis method according to claim 1, wherein
    two variables are specified from the selected variables,
    the first variable is a variable having a smaller bit width of the two specified variables, and
    the another variable is a variable having a larger bit width of the two specified variables.

9. The behavioral synthesis method according to claim 1, wherein the first variable is a variable having a smallest bit width among the selected variables.

10. The behavioral synthesis method according to claim 1, wherein a multiplexer that selects one of data of the first variable and data of the another variable and supplies the selected data to the first register is allocated in the synthesized circuit.

11. The behavioral synthesis method according to claim 1, wherein a clock gating circuit that inactivates a clock supplied to the second register is allocated in the synthesized circuit.

12. The behavioral synthesis method according to claim 1, wherein a number of the selected variables is two.

13. A behavioral synthesis method comprising:
    creating data flow graph information that is obtained by scheduling a timing of operation behavior of variables from behavioral description information including the operation behavior of the variables, each of the variables being input data to operation or output data from operation;
    generating lifetime information for each of the variables from the scheduled data flow graph information, the lifetime information being a period during which data needs to be held in the variable;
    selecting first and second variables whose lifetimes do not overlap on a time axis, the first variable being defined to have a first bit width;
    allocating a first register having the first bit width to the first variable and bits of the first bit width included in the second variable;
    allocating a second register to bits other than the bits of the first bit width included in the second variable; and
    outputting circuit information of a synthesized circuit including the first and second registers.

14. A non-transitory computer readable medium storing a behavioral synthesis program that causes a computer to execute behavioral synthesis processing, the behavioral synthesis processing comprising:
    creating data flow graph information that is obtained by scheduling a timing of operation behavior of variables based on behavioral description information including the operation behavior of the variables, each of the variables being input data to operation or output data from operation;
    generating lifetime information for each of the variables based on the scheduled data flow graph information, the lifetime information being a period during which data needs to be held in the variable;
    selecting, among the variables, variables having lifetimes that do not overlap on a time axis, based on the generated lifetime information;
    allocating a first register having a first bit width to a first variable included in the selected variables and bits of the first bit width within another variable included in the selected variables, the first variable being defined to have the first bit width;
    allocating a second register to bits other than the bits of the first bit width within the another variable; and
    outputting circuit information of a synthesized circuit including the first and second registers.

15. The non-transitory computer readable medium storing a behavioral synthesis program according to claim 14, wherein
- in the allocation of the first register, the another variable is divided into bits of the first bit width and bits other than the bits of the first bit width, and the first register is allocated to the bits of the first bit width, and
- in the allocation of the second register, the second register is allocated to the bits other than the bits of the first bit width.

16. The non-transitory computer readable medium storing a behavioral synthesis program according to claim 14, wherein number of the selected variables is two.

17. A behavioral synthesis apparatus comprising:
- a scheduling unit that creates data flow graph information that is obtained by scheduling a timing of operation behavior of variables based on behavioral description information including the operation behavior of the variables, each of the variables being input data to operation or output data from operation;
- a lifetime generation unit that generates lifetime information for each of the variables based on the scheduled data flow graph information, the lifetime information being a period during which data needs to be held in the variable;
- a variable select unit that selects, among the variables, variables lifetimes that do not overlap on a time axis;
- a register allocation unit that allocates a first register having a first bit width to a first variable included in the selected variables and bits of the first bit width within another variable included in the selected variables and allocates a second register to bits other than the bits of the first bit width within the another variable, the first variable being defined to have the first bit width; and
- a circuit information output unit that outputs circuit information of a synthesized circuit including the first and second registers.

18. The behavioral synthesis apparatus according to claim 17, wherein the register allocation unit divides the another variable into bits of the first bit width and bits other than the bits of the first bit width, allocates the first register to the bits of the first bit width, and allocates the second register to the bits other than the bits of the first bit width.

19. The behavioral synthesis apparatus according to claim 17, wherein number of the selected variables is two.

* * * * *